(12) United States Patent
Gu

(10) Patent No.: US 11,777,484 B2
(45) Date of Patent: Oct. 3, 2023

(54) COMPARATOR AND DECISION FEEDBACK EQUALIZATION CIRCUIT

(71) Applicant: CHANGXIN MEMORY TECHNOLOGIES, INC., Hefei (CN)

(72) Inventor: Yinchuan Gu, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/658,245

(22) Filed: Apr. 6, 2022

(65) Prior Publication Data

US 2023/0012066 A1 Jan. 12, 2023

Related U.S. Application Data

(63) Continuation of application No. PCT/CN2021/117047, filed on Sep. 7, 2021.

(30) Foreign Application Priority Data

Jul. 12, 2021 (CN) .......................... 202110783320.9

(51) Int. Cl.
H03K 5/24 (2006.01)
H04L 25/03 (2006.01)
H03K 3/037 (2006.01)

(52) U.S. Cl.
CPC ............. *H03K 5/249* (2013.01); *H03K 3/037* (2013.01); *H04L 25/03057* (2013.01)

(58) Field of Classification Search
CPC ............. G01R 19/0038; H03K 5/2418; H03K 5/2445; H03K 5/2481

(Continued)

(56) References Cited

U.S. PATENT DOCUMENTS 6,147,514 A * 11/2000 Shiratake ................. G11C 7/06
327/55
8,248,107 B2 8/2012 Ding
(Continued)

FOREIGN PATENT DOCUMENTS

CN 102844984 A 12/2012
CN 103973273 A 8/2014
(Continued)

OTHER PUBLICATIONS

Young-Ju Kim et al., ISSCC 2018 / Session 12 / DRAM / 12.1, A 16Gb 18Gb/s/pin GDDR6 DRAM with Per-Bit Trainable Single-Ended DFE and PLL-Less Clocking, Samsung Electronics, Hwaseong, Korea, ISSCC 2018 /Feb. 13, 2018 /10:15 AM.

(Continued)

*Primary Examiner* — Quan Tra
(74) *Attorney, Agent, or Firm* — SYNCODA LLC; Feng Ma

(57) ABSTRACT

A comparator includes a first-stage circuit, a second-stage circuit, a first switching circuit and a second switching circuit. The first-stage circuit includes a first input circuit and a second input circuit. The first switching circuit is configured to control the conduction of the first input circuit, and the second switching circuit is configured to control the conduction of the second input circuit. The first input circuit is configured to generate a first differential signal in a sampling phase when being switched on. The second input circuit is configured to generate a second differential signal in a sampling phase when being switched on. The second-stage circuit is configured to amplify and latch the first differential signal or the second differential signal in a regeneration phase to output a comparison signal.

17 Claims, 14 Drawing Sheets

(58) Field of Classification Search
USPC .......................................................... 327/65
See application file for complete search history.

(56) References Cited

U.S. PATENT DOCUMENTS

| | | | |
|---|---|---|---|
| 10,505,519 B1* | 12/2019 | Chen | ...................... H03K 3/037 |
| 10,917,100 B2 | 2/2021 | Rattan | |
| 11,496,134 B2* | 11/2022 | Lee | .................. H03K 19/00315 |
| 2011/0221477 A1 | 9/2011 | Ding | |
| 2020/0204184 A1 | 6/2020 | Rattan | |

FOREIGN PATENT DOCUMENTS

| | | |
|---|---|---|
| CN | 108270420 A | 7/2018 |
| KR | 20180015446 A | 2/2018 |

OTHER PUBLICATIONS

Young-Ju Kim et al., A 16-GB, 18-Gb/s/pin GDDR6 DRAM With Per-Bit Trainable Single-Ended DFE and PLL-Less Clocking, IEEE Journal of Solid-State Circuits, vol. 54, No. 1, Jan. 2019.

* cited by examiner

COMPARATOR AND DECISION FEEDBACK EQUALIZATION CIRCUIT

CROSS-REFERENCE TO RELATED APPLICATIONS

This is a continuation of International Patent Application No. PCT/CN2021/117047 filed on Sep. 7, 2021, which claims priority to Chinese Patent Application No. 202110783320.9 filed on Jul. 12, 2021. The disclosures of these applications are hereby incorporated by reference in their entirety.

BACKGROUND

With continuous development of the computer technology, more and more products are controlled by computers and intelligence is realized. However, with continuous expansion of application scenarios, people have also put forward higher and higher requirements for computer performance, including faster operating speed and lower power consumption.

SUMMARY

The embodiments of the disclosure relate to, but are not limited to, a comparator and a decision feedback equalization (DFE) circuit.

According to the embodiments of the disclosure, there is provided a comparator, which includes a first-stage circuit, a second-stage circuit, a first switching circuit and a second switching circuit. The first-stage circuit includes a first input circuit and a second input circuit.

The first input circuit is connected with the first switching circuit, the second input circuit is connected with the second switching circuit.

The first switching circuit and the second switching circuit are further connected with a ground terminal or a power terminal respectively, the first input circuit and the second input circuit are further connected with the ground terminal or the power terminal respectively, and the first input circuit and the second input circuit are both further connected with the second-stage circuit.

The second-stage circuit is connected with the power terminal or the ground terminal.

The first switching circuit is configured to control conduction of the first input circuit according to a first feedback signal, a second feedback signal and a clock signal.

The second switching circuit is configured to control conduction of the second input circuit according to the first feedback signal, the second feedback signal and the clock signal.

The first input circuit is configured to generate a first differential signal according to an input signal and a first reference signal in a sampling phase when being switched on.

The second input circuit is configured to generate a second differential signal according to the input signal and a second reference signal in a sampling phase when being switched on.

The second-stage circuit is configured to amplify and latch the first differential signal or the second differential signal in a regeneration phase to output a comparison signal.

According to the embodiments of the disclosure, there is further provided a decision feedback equalization circuit, which includes N stages of comparators as described in the above solution. N is a positive integer greater than 1.

A first input terminal of the comparator in each stage receives an input signal, a second input terminal of the comparator in each stage receives a first reference signal, and a third input terminal of the comparator in each stage receives a second reference signal.

A fourth input terminal of the first-stage comparator is connected with an output terminal of the Nth-stage comparator, and receives an Nth-stage comparison signal output by the Nth-stage comparator; and a fifth input terminal of the first-stage comparator receives a first clock signal.

A fourth input terminal of the ith-stage comparator is connected with an output terminal of the (i−1)th-stage comparator, and receives an (i−1)th-stage comparison signal output by the (i−1)th-stage comparator; a fifth input terminal of the ith-stage comparator receives an ith clock signal, and i is greater than 1 and less than or equal to N.

Triggered by a clock signal in each stage, and according to a comparison signal corresponding to a fourth input terminal of the comparator in each stage, the comparator in each stage compares the input signal with the first reference signal, or compares the input signal with the second reference signal, to output a comparison signal in each stage.

DETAILED DESCRIPTION

A memory device is an indispensable part of a computer hardware system, and can store instructions and data during operation of a computer to ensure normal operation of the computer. Among them, a comparator is an important part of commonly used memory devices, and improving the performance of the comparator helps to improve the overall performance of a computer.

Figure 1:
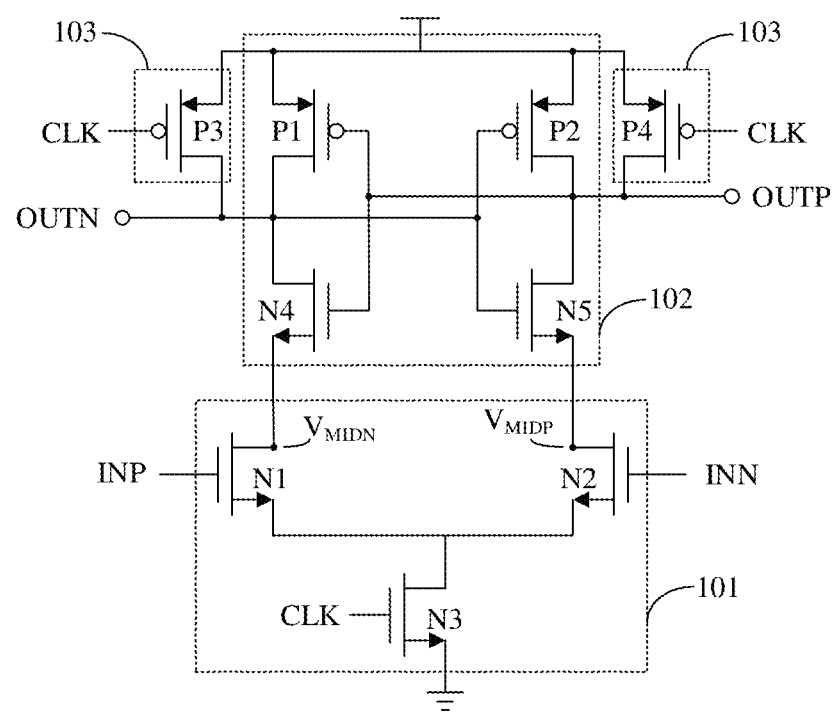
FIG. 1 illustrates a schematic structural diagram of a comparator provided in some implementations.

FIG. 1 illustrates a schematic structural diagram of a comparator in some implementations. As illustrated in FIG. 1, the comparator 10 includes an input circuit 101, an output circuit 102 and a reset circuit 103. The input circuit 101 is connected with an input terminal of the output circuit 102, and the reset circuit 103 is also connected with the output circuit 102.

The input circuit 101 includes a N-Metal-Oxide-Semiconductor (NMOS) transistor N1, an NMOS transistor N2, and an NMOS transistor N3. The sources of N1 and N2 are both connected with the drain of N3. The source of N3 is connected with a ground terminal. The gate of N1 serves as a first input terminal INP of the comparator 10 to receive an input signal. The gate of N2 serves as a second input terminal INN of the comparator 10 to receive a reference signal. The gate of N3 receives a clock signal CLK. N1 and N2 are an input pair that generates differential currents corresponding to differential input levels (i.e., the input signal and the reference signal).

The output circuit 102 includes a P-Metal-Oxide-Semiconductor (PMOS) transistor P1, a PMOS transistor P2, an NMOS transistor N4 and an NMOS transistor N5. The gate of P1, the drain of P2, the gate of N4, and the drain of N5 are all connected with a first output terminal OUTP of the comparator 10. The drain of P1, the gate of P2, the drain of N4, and the gate of N5 are all connected with a second output terminal OUTN of the comparator 10. The source of P1 and the source of P2 are both connected with a power terminal. The source of N4 is connected with the drain of N1. The source of N5 is connected with the drain of N2.

The reset circuit 103 includes a PMOS transistor P3 and a PMOS transistor P4. The drain of P3 is connected with the second output terminal OUTN of the comparator 10. The drain of P4 is connected with the first output terminal OUTP of the comparator 10. The source of P3 and the source of P4 are both connected with the power terminal. The gate of P3 and the gate of P4 receive the clock signal CLK respectively.

Figure 2:
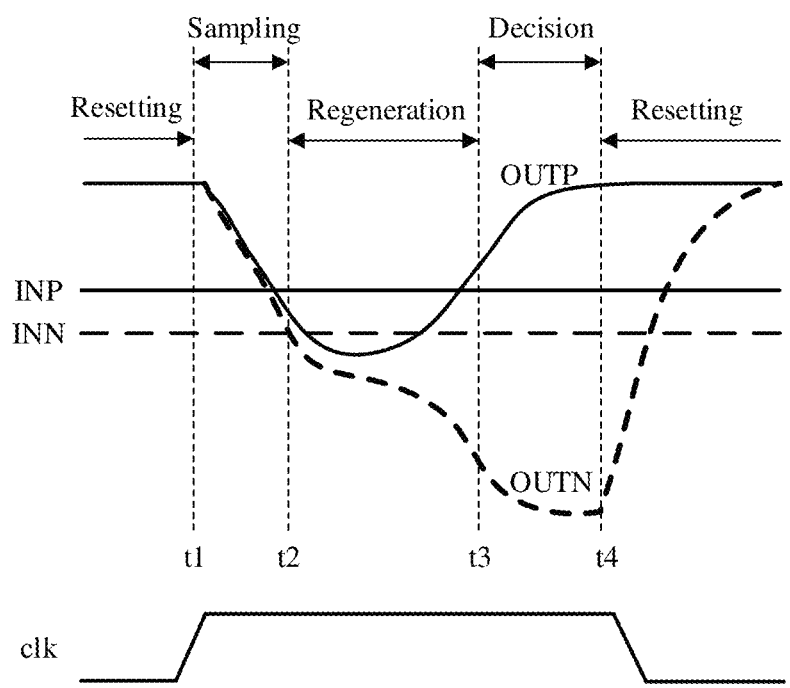
FIG. 2 illustrates a schematic diagram of an operating process of a comparator in some implementations.

The operating process of the comparator 10 is divided into four stages, i.e., a reset stage, a sampling stage, a regeneration phase and a decision phase. FIG. 2 illustrates an operating timing diagram of the comparator 10, and the operating process of the comparator 10 will be described below in combination with FIG. 2.

The reset phase is a period before time t1. At this phase, the clock signal CLK is at a low level, N3 is triggered by the clock signal CLK to be in a switched-off state, and the input circuit 101 and the output circuit 102 stop operating. At the same time, P3 and P4 are triggered by the clock signal CLK to be in a switched-on state, and the reset circuit 103 operates to keep the voltages at the first output terminal OUTP and the second output terminal OUTN at a high level.

The sampling phase is a period from time t1 to time t2. At the beginning of the sampling phase (that is, at time t1), the clock signal CLK is changed to a high level. At this time, P3 and P4 are triggered by the clock signal CLK to be in a switched-off state, and the reset circuit stops operating. At the same time, N3 is triggered by the clock signal CLK to be in a switched-on state, the input circuit 101 and the output circuit 102 operate, the first input terminal INP acquires the input signal, and the second input terminal INN acquires the reference signal. Then, the voltages at the first output terminal OUTP and the second output terminal OUTN gradually decrease to a low level due to the influence of the input signal and the reference signal. At the end of the sampling phase (that is, at time t2), P1 is triggered by the low level of the first output terminal OUTP to be in a switched-on state, and P2 is triggered by the low level of the second output terminal OUTN to be in a switched-on state.

It should be noted that in the sampling phase, the voltages at the first output terminal OUTP and the second output terminal OUTN decrease at different rates due to different voltages of the input signal and the reference signal. As a result, the first output terminal OUTP and the second output terminal OUTN have a voltage difference. In FIG. 2, because the voltage of the input signal is higher than that of the reference signal, the voltage at the second output terminal OUTN decreases faster than the voltage at the first output terminal OUTP, and the voltage at the second output terminal OUTN is lower than the voltage at the first output terminal OUTP. It can be understood that when the voltage of the input signal is lower than that of the reference signal, that is, when the voltage of a signal acquired by the first input terminal INP is lower than that of the second input terminal INN, the voltage at the first output terminal OUTP will decrease faster than the voltage at the second output terminal OUTN, and the voltage at the first output terminal OUTP will be lower than the voltage at the second output terminal OUTN. Conversely, when the input signal is higher than the reference signal, that is, when the voltage of a signal acquired by the first input terminal INP is higher than that of the second input terminal INN, the voltage at the first output terminal OUTP will be higher than the voltage at the second output terminal OUTN.

The regeneration phase is a period from time t2 to time t3. At the beginning of the regeneration phase (that is, at time t2), P1 and P2 are triggered to be in a switched-on state, a cross-coupled inverter composed of P1 and P2 amplifies the voltage difference formed between the first output terminal OUTP and the second output terminal OUTN during the sampling phase via positive feedback. At the same time, N1 and N2 sense the differential input levels (i.e., the input signal and the reference signal) and generate a differential drain current to charge $V_{MIDP}$ and $V_{MIDN}$, so that it has a large signal swing relative to input polarity. At the end of the regeneration phase (that is, at time t3), the voltage difference between the first output terminal OUTP and the second output terminal OUTN is amplified to a sufficient degree. Therefore, the first output terminal OUTP and the second output terminal OUTN regenerate to form a high level and a low level respectively. If the voltage of the input signal is higher than that of the reference signal, as illustrated in FIG. 2, the first output terminal OUTP regenerates to form a high level, and the second output terminal OUTN regenerates to form a low level. If the voltage of the input signal is lower than that of the reference signal, the first output terminal OUTP regenerates to form a low level, and the second output terminal OUTN regenerates to form a high level.

The decision phase is a period from time t3 to time t4. The output circuit 102 latches the levels of the first output terminal OUTP and the second output terminal OUTN to maintain the levels, and outputs the latched levels as a comparison signal.

When the next operating cycle arrives (that is, at time t4), the clock signal is changed to a low level, N3 is triggered by the clock signal CLK to be in a switched-off state, and the input circuit 101 and the output circuit 102 stop operating. At the same time, P3 and P4 are triggered by the clock signal CLK to be in a switched-on state, and the reset circuit 103 operates to raise the voltages at the first output terminal OUTP and the second output terminal OUTN to a high level.

It can be seen that the operating process of the comparator is to compare the input signal with the reference signal. If the input signal is greater than the reference signal, a first comparison signal is output. If the input signal is smaller than the reference signal, a second comparison signal inverted from the first comparison signal is output. In this way, the level of the input signal is determined.

Figure 3:
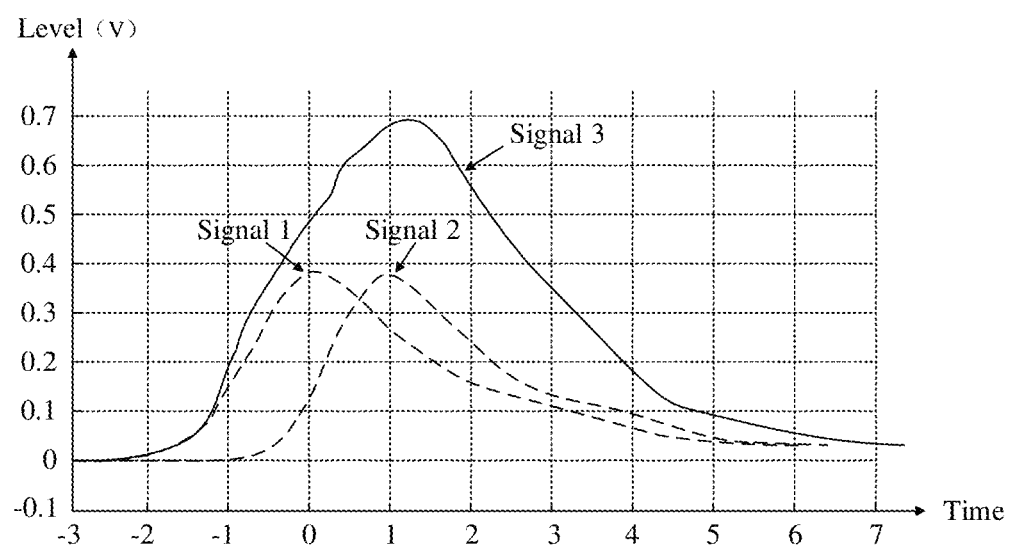
FIG. 3 illustrates a schematic diagram of inter-symbol interference in some implementations.

It should be noted that during the operation of the comparator, there exists inter-symbol interference (ISI). Inter-symbol interference refers to that due to unsatisfactory overall characteristics of system transmission, signals at the previous and next time nodes have waveform distortion and broadening, and the previous waveform forms a very long tail spreading to the sampling time point for the signal at the current time node, thereby causing interference to the determination of the signal at the current time node. FIG. 3 illustrates a schematic diagram of inter-symbol interference. As illustrated in FIG. 3, the waveforms of signal 1, signal 2 and signal 3 all form a long tail after their peaks, which slowly drops to 0 after a few time nodes. Therefore, the determination of the signal at the time node after the peak is affected, and a symbol that is originally determined as a low level may be determined as a high level.

In digital integrated circuits, binary digital signals "1" and "0" are usually used to realize the function. The comparator may be used to determine whether an input signal is a digital signal "1" or "0". When the level of the input signal is greater than that of the reference signal, the input signal is determined as a digital signal "1" (i.e., a high-level signal). When the level of the input signal is less than that of the reference signal, the input signal is determined as a digital signal "0" (i.e., a low-level signal). Then, when the input signal at the previous time node is a digital signal "1", because the input signal is at a high level, the actual input signal level at the next time node will be raised higher than the expected level. If the input signal at the next time node at this time is a digital signal "0", that is, the expected level is low, the actual level may be raised to be greater than that of the reference signal, and the input signal is determined as a digital signal "1", which causes signal distortion. In the same way, when the input signal at the previous time node is a digital signal "0", because the input signal is at a low level, the actual input signal level at the next time node will be lower than the expected level. If the input signal at the next time node at this time is a digital signal "1", that is, the expected level is high, the actual level may be lowered to be less than that of the reference signal, and the input signal is determined as a digital signal "0", which causes signal distortion.

Figure 4:
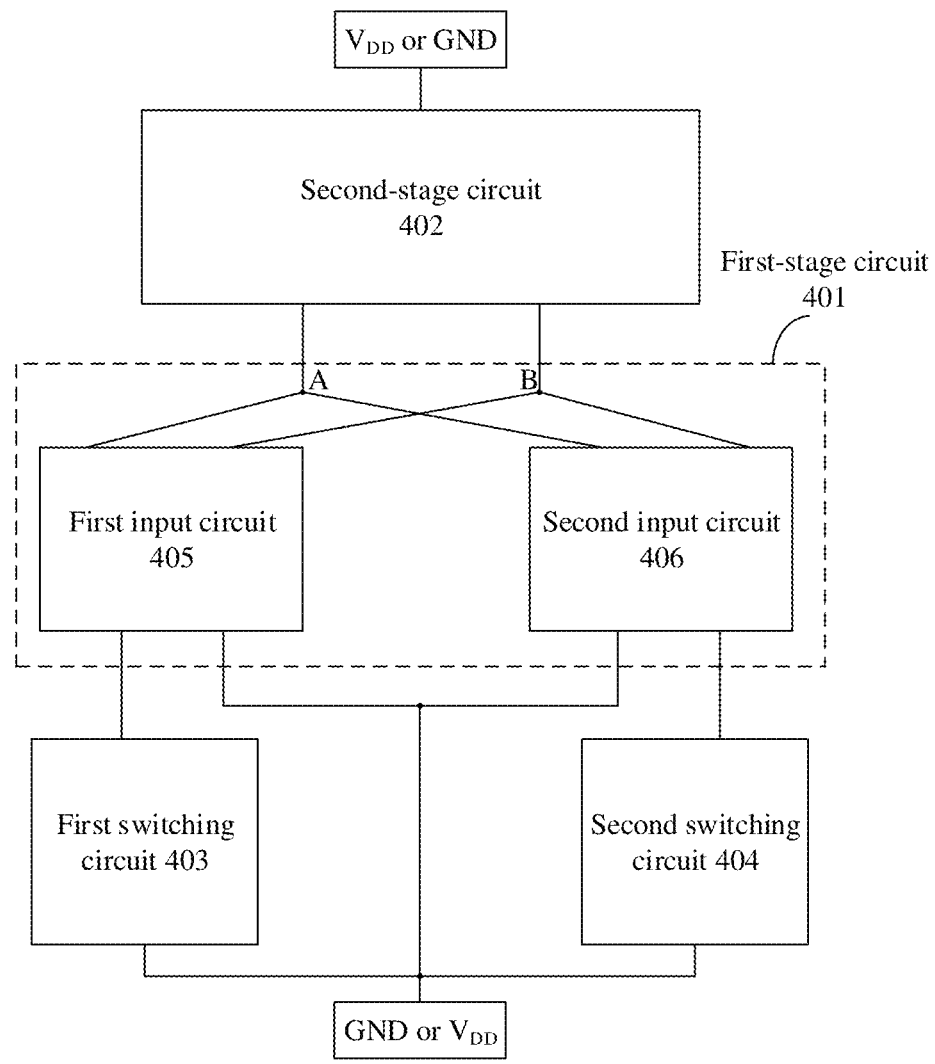
FIG. 4 illustrates a first schematic structural diagram of a comparator provided by an embodiment of the disclosure.

FIG. 4 illustrates a schematic structural diagram of a comparator provided by an embodiment of the disclosure. As illustrated in FIG. 4, the comparator 40 includes a first-stage circuit 401, a second-stage circuit 402, a first switching circuit 403, and a second switching circuit 404. The first-stage circuit 401 includes a first input circuit 405 and a second input circuit 406.

The first input circuit 405 is connected with the first switching circuit 403. The second input circuit 406 is connected with the second switching circuit 404. Both the first input circuit 405 and the second input circuit 406 are further connected with the second-stage circuit 402. The first switching circuit 403 and the second switching circuit 404 are further connected with a ground terminal GND or a power terminal VDD respectively. The first input circuit 405 and the second input circuit 406 are further connected with the ground terminal GND or the power terminal VDD respectively. The second-stage circuit 402 is connected with the power terminal VDD or the ground terminal GND.

It should be noted that, whether the first switching circuit 403, the second switching circuit 404, the first input circuit 405, the second input circuit 406 and the second-stage circuit 402 are connected with the ground terminal or the power terminal depends on electronic components used in the comparator 40. When the comparator 40 uses an electronic component solution, the first switching circuit 403, the second switching circuit 404, the first input circuit 405, and the second input circuit 406 are respectively connected with the ground terminal, and the second-stage circuit 402 is connected with the power terminal. When the comparator 40 uses another electronic component solution, the first switching circuit 403, the second switching circuit 404, the first input circuit 405 and the second input circuit 406 are connected with the power terminal respectively, and the second-stage circuit 402 is connected with the ground terminal. The disclosure is not limited thereto.

In the embodiments of the disclosure, the first switching circuit 403 receives a first feedback signal $F_{i-1}$, a second feedback signal $F_{i-1}B$ and a clock signal WCK, and is configured to control the conduction of the first input circuit 405 according to the first feedback signal $F_{i-1}$, the second feedback signal $F_{i-1}B$ and the clock signal WCK. The first feedback signal $F_{i-1}$ and the second feedback signal are mutually inverted signals.

The second switching circuit 404 receives the first feedback signal $F_{i-1}$, the second feedback signal $F_{i-1}B$ and the clock signal WCK, and is configured to control the conduction of the second input circuit 406 according to the first feedback signal $F_{i-1}$, the second feedback signal $F_{i-1}B$ and the clock signal WCK.

The first input circuit 405 receives an input signal DQ and a first reference signal $V_{REF\_}1$, and is configured to generate a first differential signal according to the input signal DQ and the first reference signal $V_{REF\_}1$ in a sampling phase when being switched on, and transmit the first differential signal to the second-stage circuit 402 via a connecting point A and a connecting point B.

The second input circuit 406 receives the input signal DQ and a second reference signal $V_{REF\_}2$, and is configured to generate a second differential signal according to the input signal DQ and the second reference signal $V_{REF\_}2$ in a sampling phase when being switched on, and transmit the second differential signal to the second-stage circuit 402 via the connecting point A and the connecting point B.

The second-stage circuit 402 receives the first differential signal or the second differential signal via the connecting point A and the connecting point B, and is configured to amplify and latch the first differential signal or the second differential signal in a regeneration phase to output a comparison signal. The comparison signal includes a first comparison subsignal $F_i$ and a second comparison subsignal $F_iB$, and $F_i$ and $F_iB$ are mutually inverted signals.

In the embodiments of the disclosure, the comparator 40 uses two different reference signals, i.e., the first reference signal $V_{REF\_}1$ and the second reference signal $V_{REF\_}2$. $V_{REF\_}1$ is greater than or less than $V_{REF\_}2$. Correspondingly, the comparator 40 provided in the embodiments of the disclosure may use two circuit solutions. At the same time, both $V_{REF\_}1$ and $V_{REF\_}2$ are less than a high level of the input signal DQ and greater than a low level of the input signal DQ. The specific voltages of the two reference signals $V_{REF\_}1$ and $V_{REF\_}2$ may be set according to actual needs, which are not limited herein.

Taking the comparator 40 using the circuit solution in which $V_{REF\_1}$ is greater than $V_{REF\_2}$ as an example, when the DQ at the previous time node is at a high level, in the DQ sampling phase of the current time node, the first switching circuit 403 controls the first input circuit 405 to be being switched on, the second switching circuit 404 controls the second input circuit 406 to be switched off, and $V_{REF\_1}$ is compared with DQ. Further, if the DQ at the current time node is at a low level, since $V_{REF\_1}$ is higher, the DQ at the current time node will not be greater than $V_{REF\_1}$ after being raised and can still be determined as a digital signal "0", and the signal is not distorted. If the DQ at the current time node is at a high level, since $V_{REF\_1}$ is less than the high level of the DQ, the DQ at the current time node will still be greater than $V_{REF\_1}$ after being raised and can still be determined as a digital signal "1", and the signal is not distorted. In the same way, when the DQ at the previous time node is at a low level, in the DQ sampling phase of the current time node, the second switching circuit 404 controls the second input circuit 406 to be being switched on, the first switching circuit 403 controls the first input circuit 405 to be switched off, and $V_{REF\_2}$ is compared with the DQ at the current time node. Further, if the DQ at the current time node is at a high level, since $V_{REF\_2}$ is lower, the DQ at the current time node will still not be smaller than $V_{REF\_2}$ after being lowered, the DQ at the current time node is still determined as a digital signal "1", and the signal is not distorted. If the DQ at the current time node is at a low level, since $V_{REF\_2}$ is greater than the low level of the DQ, the DQ at the current time node is still lower than $V_{REF\_2}$ after being lowered and is still determined as a digital signal "0", and the signal is not distorted.

Correspondingly, if the comparator 40 uses a circuit solution in which $V_{REF\_1}$ is smaller than $V_{REF\_2}$, then when the DQ at the previous time node is at a high level, in the DQ sampling phase of the current time node, the second switching circuit 404 controls the second input circuit 406 to be switched on, the first switching circuit 403 controls the first input circuit 405 to be switched off, and $V_{REF\_2}$ is compared with the DQ at the current time node. When the DQ at the previous time node is at a low level, in the DQ sampling phase of the current time node, the first switching circuit 403 controls the first input circuit 405 to be being switched on, the second switching circuit 404 controls the second input circuit 406 to be switched off, and the first reference signal $V_{REF\_1}$ is compared with the DQ at the current time node. Thus, it is ensured that the DQ at the current time node is not distorted.

It can be understood that the comparator 40 used in the embodiments of the disclosure can use a more appropriate reference signal to be compared with the input signal at the current time node according to the input signal at the previous time node. In this way, the problems caused by inter-symbol interference are eliminated, the comparison result is not affected by the inter-symbol interference, and the input signal is ensured to be not distorted. At the same time, the first switching circuit 403 is connected with the control terminal of the first input circuit 405, and the second switching circuit 404 is connected with the control terminal of the second input circuit 406, which do not affect the direct connection of the first input circuit 405 and the second input circuit 406 with the ground terminal or the power terminal respectively. Therefore, a smaller number of transistors may be used in a main circuit path of the comparator 40, and the total operating voltage may be lowered under the condition that the divided voltage of each transistor is unchanged.

Figure 5:
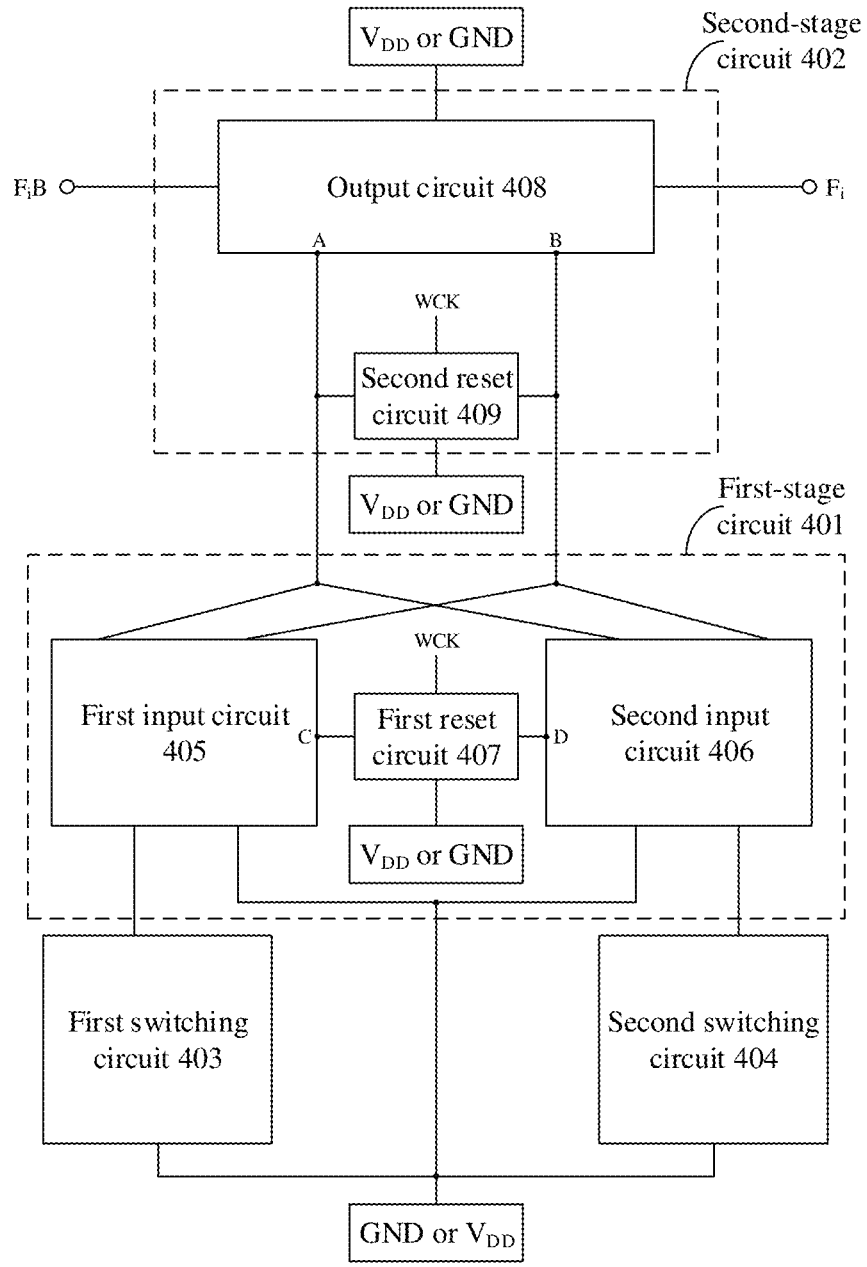
FIG. 5 illustrates a second schematic structural diagram of a comparator provided by an embodiment of the disclosure.

In some embodiments of the disclosure, as illustrated in FIG. 5, the first-stage circuit 401 may further include a first reset circuit 407.

The first input circuit 405 and the second input circuit 406 are connected via the first reset circuit 407. The first reset circuit 407 is further connected with the power terminal VDD or the ground terminal GND. The first reset circuit 407 receives the clock signal WCK, and is configured to reset the first input circuit 405 and the second input circuit 406 in a reset phase according to the clock signal WCK.

In the embodiments of the disclosure, triggered by the clock signal WCK, the first reset circuit 407 may conduct a connecting point C of the first input circuit 405 and a connecting point D of the second input circuit 406 to the power terminal VDD respectively, thereby raising the voltages of the connecting point C and the connecting point D to a high level to complete the resetting of the first input circuit 405 and the second input circuit 406. Alternatively, triggered by the clock signal WCK, the first reset circuit 407 may conduct the connecting point C of the first input circuit 405 and the connecting point D of the second input circuit 406 to the ground terminal GND respectively, thereby lowering the voltages of the connecting point C and the connecting point D to a low level to complete the resetting of the first input circuit 405 and the second input circuit 406.

It should be noted that, whether the first reset circuit 407 is connected with the ground terminal or the power terminal depends on the electronic components used in the comparator 40. When the comparator 40 uses an electronic component solution, the first reset circuit 407 is connected with the power terminal. When the comparator 40 uses another electronic component solution, the first reset circuit 407 is connected with the ground terminal, which is not limited herein.

It can be understood that the use of the first reset circuit 407 to reset a local circuit of the comparator 40 can enable the comparator 40 to complete the reset phase faster and increase the operating speed of the comparator 40.

In some embodiments of the disclosure, as illustrated in FIG. 5, the second-stage circuit 402 includes an output circuit 408 and a second reset circuit 409.

The second reset circuit 409 is connected with the output circuit 408. The output circuit 408 is further connected with the power terminal VDD or the ground terminal GND. The second reset circuit 409 is further connected with the power terminal VDD or the ground terminal GND. The output circuit 408 is configured to amplify and latch the first differential signal or the second differential signal in the regeneration phase to output comparison subsignals $F_i$ and $F_iB$. The second reset circuit 409 receives the clock signal WCK, and is configured to reset the output circuit 408 in the reset phase according to the clock signal WCK.

It should be noted that, whether the output circuit 408 and the second reset circuit 409 are connected with the ground terminal or the power terminal depends on the electronic components used in the comparator 40. When the comparator 40 uses an electronic component solution, the output circuit 408 and the second reset circuit 409 are both connected with the power terminal. When the comparator 40 uses another electronic component solution, the output circuit 408 and the second reset circuit 409 are both connected with the ground terminal, which is not limited herein.

In the embodiments of the disclosure, triggered by the clock signal WCK, the second reset circuit 409 may conduct a connecting point A and a connecting point B of the output circuit 408 to the power terminal VDD respectively, thereby raising the voltages of the connecting point A and the connecting point B to a high level to complete the resetting of the output circuit 408. Alternatively, triggered by the clock signal WCK, the second reset circuit 409 may conduct the connecting point A and the connecting point B of the output circuit 408 to the ground terminal GND respectively, thereby lowering the voltages of the connecting point A and the connecting point B to a low level to complete the resetting of the output circuit 408.

It can be understood that the use of the second reset circuit 409 to reset a local circuit of the comparator 40 can enable the comparator 40 to complete the reset phase faster and increase the operating speed of the comparator 40.

Figure 6:
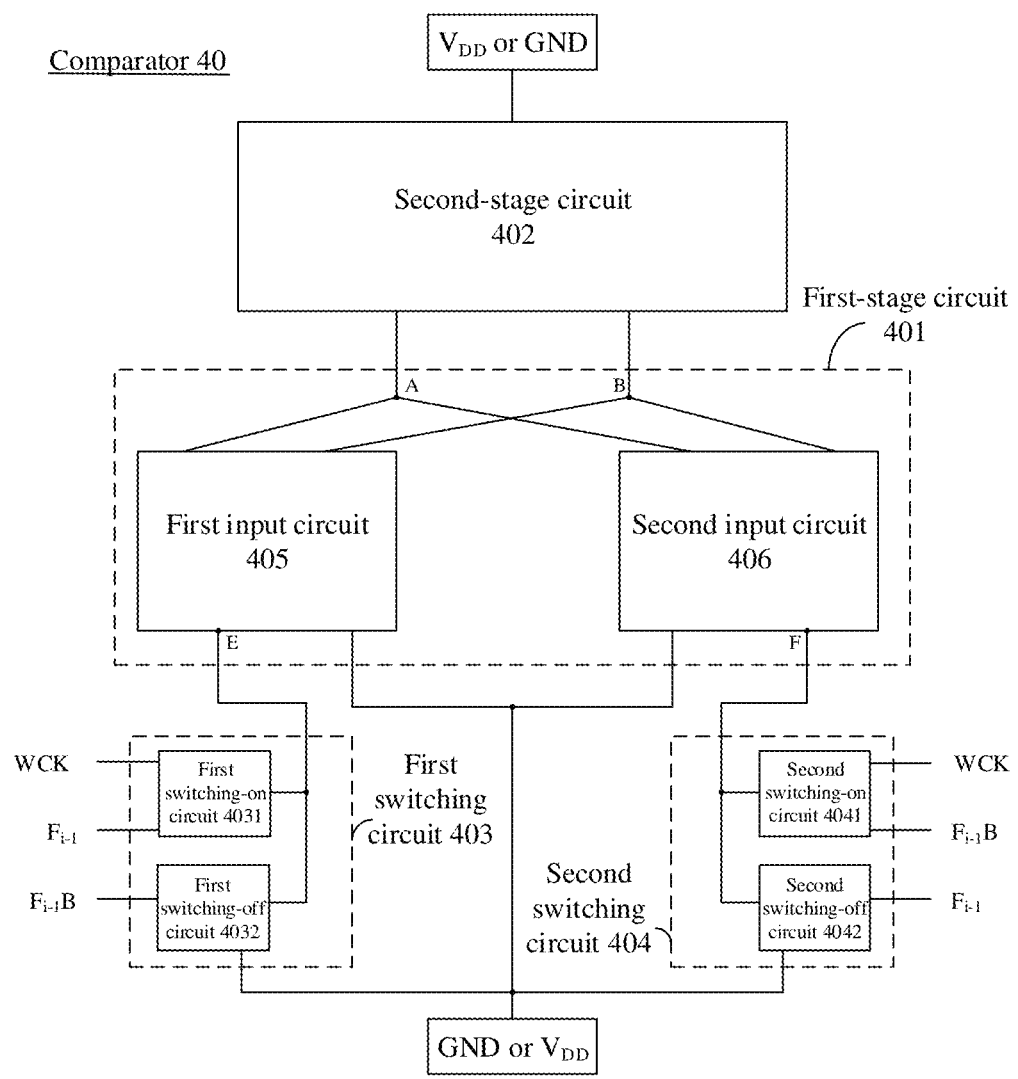
FIG. 6 illustrates a third schematic structural diagram of a comparator provided by an embodiment of the disclosure.

In some embodiments of the disclosure, as illustrated in FIG. 6, the first switching circuit 403 includes a first switching-on circuit 4031 and a first switching-off circuit 4032.

The first switching-on circuit 4031 and the first switching-off circuit 4032 are both connected with a control terminal E of the first input circuit 405. The first switching-off circuit 4032 is also connected with the ground terminal GND or the power terminal VDD. The first switching-on circuit 4031 receives a first feedback signal $F_{i-1}$ and the clock signal WCK, and is configured to conduct the clock signal WCK to the control terminal E of the first input circuit 405 under the control of the first feedback signal $F_{i-1}$. The first switching-off circuit 4032 receives a second feedback signal $F_{i-1}B$, and is configured to conduct the control terminal E of the first input circuit 405 to the ground terminal GND or the power terminal VDD under the control of the second feedback signal $F_{i-1}B$, so that the first input circuit 405 is switched off. The first feedback signal $F_{i-1}$ and the second feedback signal $F_{i-1}B$ are mutually inverted signals.

It should be noted that, whether the first switching-off circuit 4032 is connected with the ground terminal or the power terminal depends on the electronic components used in the comparator 40. When the comparator 40 uses an electronic component solution, the first switching-off circuit 4032 is connected with the ground terminal. When the comparator 40 uses another electronic component solution, the first switching-off circuit 4032 is connected with the power terminal, which is not limited herein.

In the embodiments of the disclosure, the first feedback signal $F_{i-1}$ and the second feedback signal $F_{i-1}B$ are mutually inverted signals. When the first feedback signal $F_{i-1}$ triggers the first switching-on circuit 4031 to operate, the second feedback signal $F_{i-1}B$ triggers the first switching-off circuit 4032 to not operate. At this time, the clock signal WCK is conducted to the control terminal E of the first input circuit 405 by the first switching-on circuit 4031, for controlling the first input circuit 405 to operate in the sampling phase of the comparator 40. When the first feedback signal $F_{i-1}$ triggers the first switching-on circuit 4031 to not operate, the second feedback signal $F_{i-1}B$ triggers the first switching-off circuit 4032 to operate. At this time, the control terminal E of the first input circuit 405 is conducted to the ground terminal GND or the power terminal VDD, and the first input circuit 405 is switched off to not operate in the sampling phase of the comparator 40.

In some embodiments of the disclosure, as illustrated in FIG. 6, the second switching circuit 404 includes a second switching-on circuit 4041 and a second switching-off circuit 4042.

The second switching-on circuit 4041 and the second switching-off circuit 4042 are both connected with a control terminal F of the second input circuit 406. The second switching-off circuit 4042 is further connected with the ground terminal GND or the power terminal VDD. The second switching-on circuit 4041 receives the second feedback signal $F_{i-1}B$ and the clock signal WCK, and is configured to conduct the clock signal WCK to the control terminal F of the second input circuit 406 under the control of the second feedback signal $F_{i-1}B$. The second switching-off circuit 4042 receives the first feedback signal $F_{i-1}$, and is configured to conduct the control terminal F of the second input circuit 406 to the ground terminal GND or the power terminal VDD under the control of the first feedback signal $F_{i-1}$, so that the second input circuit 406 is switched off. The first feedback signal $F_{i-1}$ and the second feedback signal $F_{i-1}B$ are mutually inverted signals.

It should be noted that, whether the second switching-off circuit 4042 is connected with the ground terminal or the power terminal depends on the electronic components used in the comparator 40. When the comparator 40 uses an electronic component solution, the second switching-off circuit 4042 is connected with the ground terminal. When the comparator 40 uses another electronic component solution, the second switching-off circuit 4042 is connected with the power terminal, which is not limited herein.

In the embodiments of the disclosure, the first feedback signal $F_{i-1}$ and the second feedback signal $F_{i-1}B$ are mutually inverted signals. When the second feedback signal $F_{i-1}B$ triggers the second switching-on circuit 4041 to operate, the first feedback signal $F_{i-1}$ triggers the second switching-off circuit 4042 to not operate. At this time, the clock signal WCK is conducted to the control terminal F of the second input circuit 406 by the second switching-on circuit 4041, for controlling the second input circuit 406 to operate in the sampling phase of the comparator 40. When the second feedback signal $F_{i-1}B$ triggers the second switching-on circuit 4041 to not operate, the first feedback signal $F_{i-1}$ triggers the second switching-off circuit 4042 to operate. At this time, the control terminal F of the second input circuit 406 is conducted to the ground terminal GND or the power terminal VDD, and the second input circuit 406 is switched off and does not operate in the sampling phase of the comparator 40.

In some embodiments of the disclosure, the first switching-on circuit includes a first switching transistor, and the first switching-off circuit includes a second switching transistor.

A second terminal of the first switching transistor and a first terminal of the second switching transistor are both connected with a control terminal of the first input circuit. A second terminal of the second switching transistor is further connected with the ground terminal or the power terminal. The first switching transistor and the second switching transistor are NMOS transistors or PMOS transistors. A control terminal of the first switching transistor receives a first feedback signal, a first terminal of the first switching transistor receives a clock signal, and a control terminal of the second switching transistor receives a second feedback signal.

Figure 7:
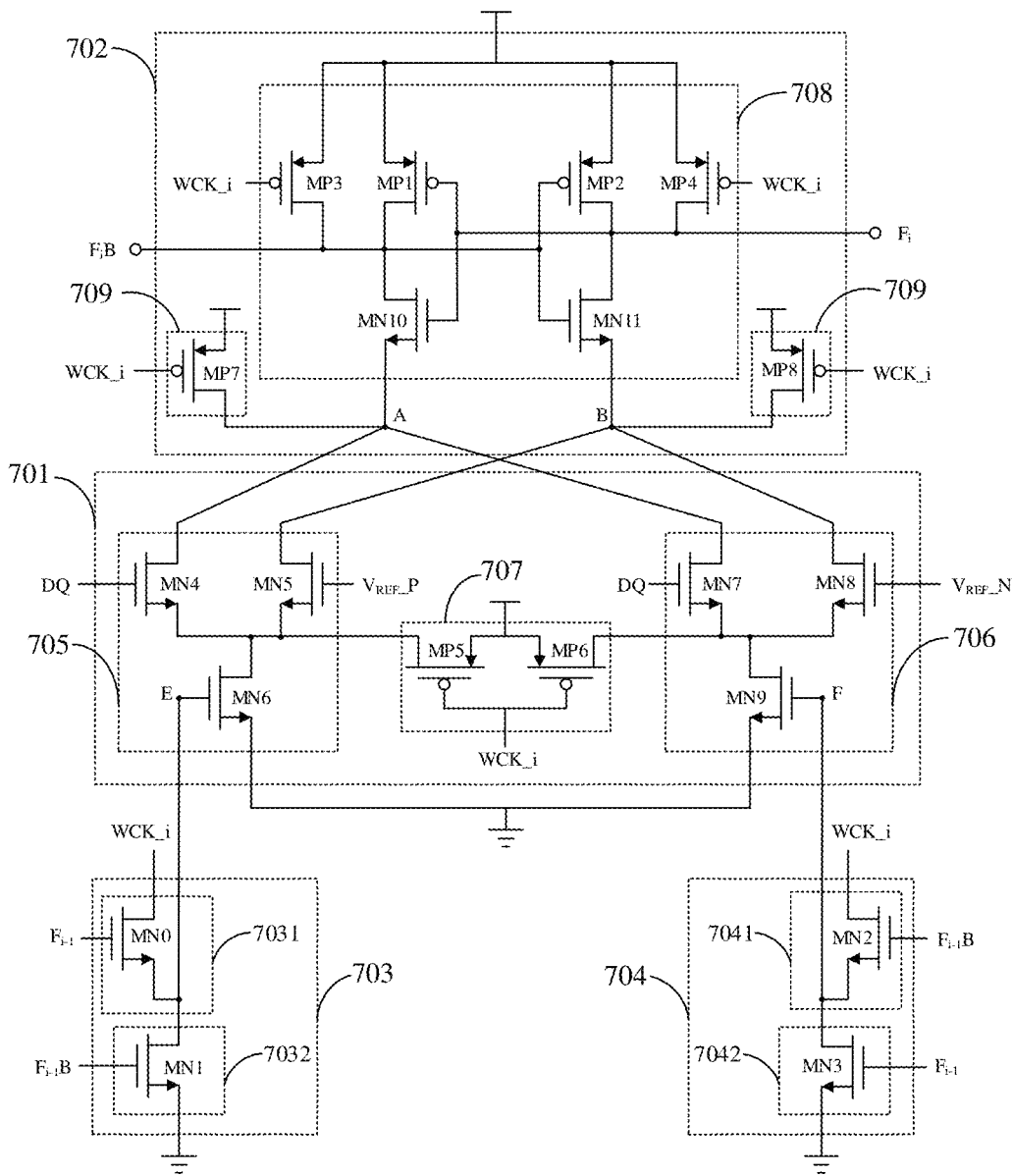
FIG. 7 illustrates a fourth schematic structural diagram of a comparator provided by an embodiment of the disclosure.
Figure 8:
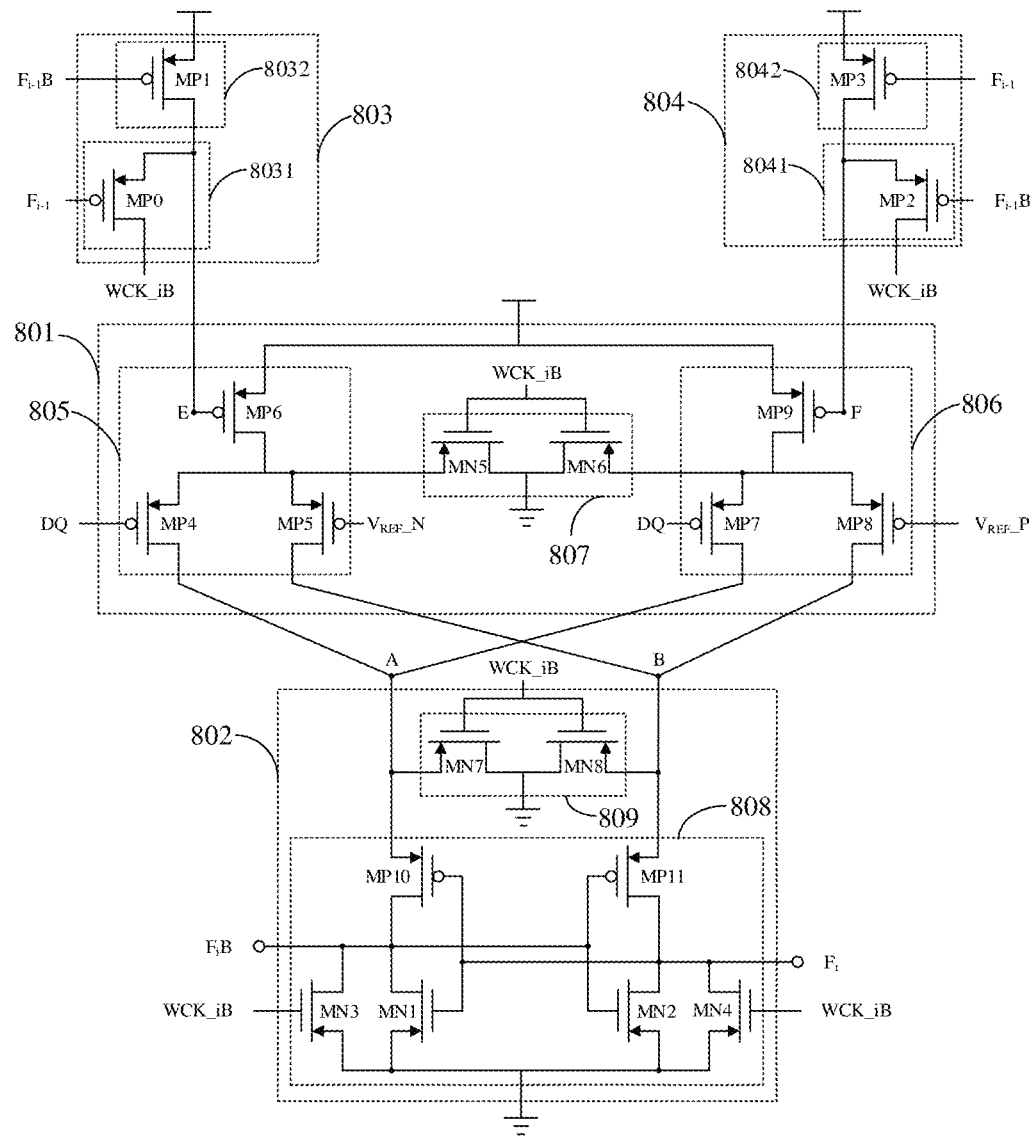
FIG. 8 illustrates a fifth schematic structural diagram of a comparator provided by an embodiment of the disclosure.

In the embodiments of the disclosure, whether the first switching transistor and the second switching transistor are NMOS transistors or PMOS transistors is determined by the circuit structure of the comparator. FIG. 7 and FIG. 8 illustrate two different circuit structures of the comparator provided by the embodiments of the disclosure, which will be described below with reference to FIG. 7 and FIG. 8 respectively.

As illustrated in FIG. 7, the comparator 70 includes a first switching-on circuit 7031 and a first switching-off circuit 7032. The first switching-on circuit 7031 includes a first switching transistor MN0, and the first switching-off circuit 7032 includes a second switching transistor MN1. MN0 and MN1 are NMOS transistors. The gate of NMOS transistor serves as a control terminal, the drain of NMOS transistor serves as a first terminal, and the source of NMOS transistor serves as a second terminal. The source of MN0 and the drain of MN1 are both connected with a control terminal E of the first input circuit 705, and the source of MN1 is further connected with the ground terminal. The gate of MN0 receives a first feedback signal $F_{i-1}$, the drain of MN0 receives a clock signal WCK_i, the gate of MN1 receives a second feedback signal $F_{i-1}B$, and $F_{i-1}$ and $F_{i-1}B$ are mutually inverted signals. In the operating state, when $F_{i-1}$ is at a high level, MN0 is triggered to be in a switched-on state. At this time, $F_{i-1}B$ is at a low level and MN1 is triggered to be in a switched-off state. Thus, WCK_i is conducted to the control terminal E of the first input circuit 705 via MN0, and the first input circuit 705 is controlled by the clock signal WCK_i. When $F_{i-1}$ is at a low level, MN0 is triggered to be in a switched-off state. At this time, $F_{i-1}B$ is at a high level, and MN1 is triggered to be in a switched-on state. Thus, the control terminal E of the first input circuit 705 is connected with the ground terminal via MN1, and the first input circuit 705 is switched off.

As illustrated in FIG. 8, the comparator 80 includes a first switching-on circuit 8031 and a first switching-off circuit 8032. The first switching-on circuit 8031 includes a first switching transistor MP0, and the first switching-off circuit 8032 includes a second switching transistor MP1. MP0 and MP1 are PMOS transistors. The gate of PMOS transistor serves as a control terminal, the drain of PMOS transistor serves as a first terminal, and the source of PMOS transistor serves as a second terminal. The source of MP0 and the drain of MP1 are both connected with a control terminal E of the first input circuit 805, and the source of MP1 is further connected with the ground terminal. The gate of MP0 receives a first feedback signal $F_{i-1}$, the drain of MP0 receives a clock signal WCK_iB, the gate of MP1 receives a second feedback signal $F_{i-1}B$, and $F_{i-1}$ and $F_{i-1}B$ are mutually inverted signals. In the operating state, when $F_{i-1}$ is at a low level, MP0 is triggered to be in a switched-on state. At this time, $F_{i-1}B$ is at a high level and MP1 is triggered to be in a switched-off state. Thus, WCK_iB is conducted to the control terminal E of the first input circuit 805 via MP0, and the first input circuit 805 is controlled by WCK_iB. When $F_{i-1}$ is at a high level, MP0 is triggered to be in a switched-off state. At this time, $F_{i-1}B$ is at a low level and MP1 is triggered to be in a switched-on state. Thus, the control terminal E of the first input circuit 805 is connected with the power terminal via MP1, and the first input circuit 805 is switched off.

In some embodiments of the disclosure, the second switching-on circuit includes a third switching transistor, and the second switching-off circuit includes a fourth switching transistor.

A second terminal of the third switching transistor and a first terminal of the fourth switching transistor are both connected with a control terminal of the second input circuit. A second terminal of the fourth switching transistor is further connected with the ground terminal or the power terminal. The third switching transistor and the fourth switching transistor are NMOS transistors or PMOS transistors. A control terminal of the third switching transistor receives a second feedback signal, a first terminal of the third switching transistor receives a clock signal, and a control terminal of the fourth switching transistor receives a first feedback signal.

In the embodiments of the disclosure, whether the third switching transistor and the fourth switching transistor are NMOS transistors or PMOS transistors is determined by the circuit structure of the comparator. FIG. 7 and FIG. 8 illustrate two different circuit structures of the comparator provided by the embodiments of the disclosure, which will be described below with reference to FIG. 7 and FIG. 8 respectively.

As illustrated in FIG. 7, the comparator 70 includes a second switching-on circuit 7041 and a second switching-off circuit 7042. The second switching-on circuit 7041 includes a third switching transistor MN2, and the second switching-off circuit 7042 includes a fourth switching transistor MN3. MN2 and MN3 are NMOS transistors. The gate of NMOS transistor serves as a control terminal, the drain of NMOS transistor serves as a first terminal, and the source of NMOS transistor serves as a second terminal. The source of MN2 and the drain of MN3 are both connected with the control terminal F of the second input circuit 706, and the source of MN3 is further connected with the ground terminal. The gate of MN2 receives a second feedback signal $F_{i-1}B$, the drain of MN2 receives a clock signal WCK_i, the gate of MN3 receives a first feedback signal $F_{i-1}$, and $F_{i-1}$ and $F_{i-1}B$ are mutually inverted signals. In the operating state, when $F_{i-1}$ is at a high level, MN3 is triggered to be in a switched-on state. At this time, $F_{i-1}B$ is at a low level and MN2 is triggered to be in a switched-off state. Thus, the control terminal F of the second input circuit 706 is connected with the ground terminal via MN3, and the second input circuit 706 is switched off. When $F_{i-1}$ is at a low level, MN3 is triggered to be in a switched-off state. At this time, $F_{i-1}B$ is at a high level and MN2 is triggered to be in a switched-on state. Thus, WCK_i is conducted to the control terminal F of the second input circuit 706 via MN2, and the second input circuit 706 is controlled by WCK_i.

As illustrated in FIG. 8, the comparator 80 includes a second switching-on circuit 8041 and a second switching-off circuit 8042. The second switching-on circuit 8041 includes a third switching transistor MP2, and the second switching-off circuit 8042 includes a fourth switching transistor MP3. MP2 and MP3 are PMOS transistors. The gate of PMOS transistor serves as a control terminal, the drain of PMOS transistor serves as a first terminal, and the source of PMOS transistor serves as a second terminal. The source of MP2 and the drain of MP3 are both connected with the control terminal F of the second input circuit 806, and the source of MP3 is further connected with the ground terminal. The gate of MP2 receives a second feedback signal $F_{i-1}B$, the drain of MP2 receives a clock signal WCK_iB, the gate of MP3 receives a first feedback signal and $F_{i-1}$ and $F_{i-1}B$ are mutually inverted signals. In the operating state, when the first feedback signal $F_{i-1}$ is at a low level, the fourth switching transistor MN3 is triggered to be in a switched-on state. At this time, $F_{i-1}B$ is at a high level and MN2 is triggered to be in a switched-off state. Thus, the control terminal F of the second input circuit 806 is connected with the power terminal via MP3, and the second input circuit 806 is switched off. When $F_{i-1}$ is at a high level, MP3 is triggered to be in a switched-off state. At this time, $F_{i-1}B$ is at a low level, and MP2 is triggered to be in a switched-on state. Therefore, WCK_iB is conducted to the control terminal F of the second input circuit 806 via MP2, and the second input circuit 806 is controlled by WCK_iB.

In some embodiments of the disclosure, the first input circuit includes a first input transistor, a second input transistor and a third input transistor.

A first terminal of the first input transistor and a first terminal of the second input transistor are connected with the second-stage circuit respectively. A control terminal of the third input transistor serves as a control terminal of the first input circuit. A second terminal of the third input transistor is connected with the ground terminal or the power terminal. A second terminal of the first input transistor and a second terminal of the second input transistor are both connected with a first terminal of the third input transistor. The first to third input transistors are NMOS transistors or PMOS transistors. A control terminal of the first input transistor receives an input signal, and a control terminal of the second input transistor receives a first reference signal. When the third input transistor is triggered by the clock signal to be in a switched-on state, the first input transistor and the second input transistor generate the first differential signal according to the input signal and the first reference signal, and input the first differential signal to the second-stage circuit.

In the embodiments of the disclosure, whether the first input transistor, the second input transistor and the third input transistor are NMOS transistors or PMOS transistors is determined by the circuit structure of the comparator. FIG. 7 and FIG. 8 illustrate two different circuit structures of the comparator provided by the embodiments of the disclosure, which will be described below with reference to FIG. 7 and FIG. 8 respectively.

As illustrated in FIG. 7, the comparator 70 includes a first input circuit 705, and the first input circuit 705 includes a first input transistor MN4, a second input transistor MN5 and a third input transistor MN6. MN4, MN5 and MN6 are NMOS transistors. The gate of NMOS transistor serves as a control terminal, the drain of NMOS transistor serves as a first terminal, and the source of NMOS transistor serves as a second terminal. The drain of MN4 is connected with the second-stage circuit 702 at the connecting point A, and the drain of MN5 is connected with the second-stage circuit 702 at the connecting point B. The gate of MN6 serves as a control terminal of the first input circuit 705, the source of MN6 is connected with the ground terminal, and the source of MN4 and the source of MN5 are both connected with the drain of MN6. The gate of MN4 receives the input signal DQ, and the gate of MN5 receives the first reference signal $V_{REF\_P}$. In the operating state, when the first feedback signal $F_{i-1}$ is at a high level, the clock signal WCK_i is conducted to the gate of MN6. In this case, when the clock signal WCK_i is changed to a high level, that is, when the comparator 70 enters the sampling phase, MN6 is triggered by WCK_i to be in a switched-on state, and the first input circuit 705 is being switched on. Further, MN4 and MN5 generate a first differential signal according to the received DQ and $V_{REF\_P}$, and input the first differential signal to the second-stage circuit 702 via the connecting point A and the connecting point B.

As illustrated in FIG. 8, the comparator 80 includes a first input circuit 805, and the first input circuit 805 includes a first input transistor MP4, a second input transistor MP5 and a third input transistor MP6. MP4, MP5 and MP6 are PMOS transistors. The gate of PMOS transistor serves as a control terminal, the drain of PMOS transistor serves as a first terminal, and the source of PMOS transistor serves as a second terminal. The drain of MP4 is connected with the second-stage circuit 802 at the connecting point A, and the drain of MP5 is connected with the second-stage circuit 802 at the connecting point B. The gate of MP6 serves as a control terminal of the first input circuit 805, the source of MP6 is connected with the power terminal, and the source of MP4 and the source of MP5 are both connected with the drain of MP6. The gate of MP4 receives the input signal DQ, and the gate of MP5 receives the first reference signal $V_{REF\_N}$. In the operating state, when the first feedback signal $F_{i-1}$ is at a low level, the clock signal WCK_iB is conducted to the gate of MP6. In this case, when the clock signal WCK_iB is changed to a low level, that is, when the comparator 80 enters the sampling phase, MP6 is triggered by WCK_iB to be in a switched-on state, and the first input circuit 805 is being switched on. Further, MP4 and MP5 generate a first differential signal according to the received DQ and $V_{REF\_N}$, and input the first differential signal to the second-stage circuit 802 via the connecting point A and the connecting point B.

It should be noted that $V_{REF\_P}$ and $V_{REF\_N}$ are used to indicate the magnitude relationship between two reference signals: $V_{REF\_P}$ is greater than $V_{REF\_N}$. In the comparator 70 as illustrated in FIG. 7, since the first reference signal is greater than the second reference signal, the first reference signal uses $V_{REF\_P}$, and the second reference signal uses $V_{REF\_N}$. In the comparator 80 as illustrated in FIG. 8, since the first reference signal is smaller than the second reference signal, the first reference signal uses $V_{REF\_N}$, and the second reference signal uses $V_{REF\_P}$.

In some embodiments of the disclosure, the second input circuit includes a fourth input transistor, a fifth input transistor and a sixth input transistor.

A first terminal of the fourth input transistor and a first terminal of the fifth input transistor are connected with the second-stage circuit respectively. A control terminal of the sixth input transistor serves as a control terminal of the second input circuit. A second terminal of the sixth input transistor is connected with the ground terminal or the power terminal. A second terminal of the fourth input transistor and a second terminal of the fifth input transistor are both connected with a first terminal of the sixth input transistor. The fourth input transistor to the sixth input transistor are NMOS transistors or PMOS transistors. A control terminal of the fourth input transistor receives an input signal, and a control terminal of the fifth input transistor receives a second reference signal. When the sixth input transistor is triggered by the clock signal to be in a switched-on state, the fourth input transistor and the fifth input transistor generate the second differential signal according to the input signal and the second reference signal, and input the second differential signal to the second-stage circuit.

In the embodiments of the disclosure, whether the fourth input transistor, the fifth input transistor and the sixth input transistor are NMOS transistors or PMOS transistors is determined by the circuit structure of the comparator. FIG. 7 and FIG. 8 illustrate two different circuit structures of the comparator provided by the embodiments of the disclosure, which will be described below with reference to FIG. 7 and FIG. 8 respectively.

As illustrated in FIG. 7, the comparator 70 includes a second input circuit 706, and the second input circuit 706 includes a fourth input transistor MN7, a fifth input transistor MN8, and a sixth input transistor MN9. MN7, MN8 and MN9 are NMOS transistors. The gate of NMOS transistor serves as a control terminal, the drain of NMOS transistor serves as a first terminal, and the source of NMOS transistor serves as a second terminal. The drain of MN7 is connected with the second-stage circuit 702 at the connecting point A, and the drain of MN8 is connected with the second-stage circuit 702 at the connecting point B. The gate of MN9 serves as a control terminal of the second input circuit 706, the source of MN9 is connected with the ground terminal, and the source of MN7 and the source of MN8 are both connected with the drain of MN9. The gate of MN7 receives the input signal DQ, and the gate of MN8 receives the second reference signal $V_{REF\_N}$. In the operating state, when the first feedback signal $F_{i-1}$ is at a low level, the clock signal WCK_i is conducted to the gate of MN9. In this case, when the clock signal WCK_i is changed to a high level, that is, when the comparator 70 enters the sampling phase, MN9 is triggered by WCK_i to be in a switched-on state, and the second input circuit 706 is being switched on. Further, MN7 and MN8 generate second differential signals according to the received DQ and $V_{REF\_N}$, and input the second differential signals to the second-stage circuit 702 via the connecting point A and the connecting point B.

As illustrated in FIG. 8, the comparator 80 includes a second input circuit 806, and the second input circuit 806 includes a fourth input transistor MP7, a fifth input transistor MP8, and a sixth input transistor MP9. MP7, MP8 and MP9 are PMOS transistors. The gate of PMOS transistor serves as a control terminal, the drain of PMOS transistor serves as a first terminal, and the source of PMOS transistor serves as a second terminal. The drain of MP7 is connected with the second-stage circuit 802 at the connecting point A, and the drain of MP8 is connected with the second-stage circuit 802 at the connecting point B. The gate of MP9 serves as a control terminal of the second input circuit 806, the source of MP9 is connected with the power terminal, and the source of MP7 and the source of MP8 are both connected with the drain of MP9. The gate of MP7 receives the input signal DQ, and the gate of MP8 receives the second reference signal $V_{REF\_P}$. In the operating state, when the first feedback signal $F_{i-1}$ is at a high level, the clock signal WCK_iB is conducted to the gate of MP9. In this case, when the clock signal WCK_iB is changed to a low level, that is, when the comparator 80 enters the sampling phase, MP9 is triggered by WCK_iB to be in a switched-on state, and the second input circuit 806 is being switched on. Further, MP7 and MP8 generate second differential signals according to the received DQ and $V_{REF\_P}$, and output the second differential signals to the second-stage circuit 802 via the connecting point A and the connecting point B.

It should be noted that $V_{REF\_P}$ and $V_{REF\_N}$ are used to indicate the magnitude relationship between two reference signals: $V_{REF\_P}$ is greater than $V_{REF\_N}$. In the comparator 70 as illustrated in FIG. 7, since the first reference signal is greater than the second reference signal, the first reference signal is $V_{REF\_P}$, and the second reference signal is $V_{REF\_N}$. In the comparator 80 as illustrated in FIG. 8, since the first reference signal is smaller than the second reference signal, the first reference signal is $V_{REF\_N}$, and the second reference signal is $V_{REF\_P}$.

In some embodiments of the disclosure, the first reset circuit includes a first reset transistor and a second reset transistor.

A first terminal of the first reset transistor and a first terminal of the second reset transistor are both connected with the power terminal or the ground terminal, a second terminal of the first reset transistor is connected with the first input circuit, and a second terminal of the second reset transistor is connected with the second input circuit. The first reset transistor and the second reset transistor are PMOS transistors or NMOS transistors. A control terminal of the first reset transistor and a control terminal of the second reset transistor both receive a clock signal. When the clock signal triggers the first reset transistor and the second reset transistor to be in a switched-on state, the first input circuit is connected with the power terminal or the ground terminal via the first reset transistor to reset the first input circuit, and the second input circuit is connected with the power terminal or the ground terminal via the second reset transistor to reset the second input circuit.

In the embodiments of the disclosure, whether the first reset transistor and the second reset transistor are PMOS transistors or NMOS transistors is determined by the circuit structure of the comparator. FIG. 7 and FIG. 8 illustrate two different circuit structures of the comparator provided by the embodiments of the disclosure, which will be described below with reference to FIG. 7 and FIG. 8 respectively.

As illustrated in FIG. 7, the comparator 70 includes a first reset circuit 707, and the first reset circuit 707 includes a first reset transistor MP5 and a second reset transistor MP6. MP5 and MP6 are PMOS transistors. The gate of PMOS transistor serves as a control terminal, the source of PMOS transistor serves as a first terminal, and the drain of PMOS transistor serves as a second terminal. The source of MP5 and the source of MP6 are both connected with the power terminal, the drain of MP5 is connected with the first input circuit 705, and the drain of MP6 is connected with the second input circuit 706. The gate of MP5 and the gate of MP6 both receive the clock signal WCK_i. In the operating state, when the clock signal WCK_i is changed to a low level, that is, when the comparator 70 enters the reset phase, MP5 and MP6 are triggered by WCK_i to be in a switched-on state. The first input circuit 705 is connected with the power terminal via MP5, the second input circuit 706 is connected with the power terminal via MP6, and the voltages of the respective connecting points are raised to a high level due to the connection to the power terminal. Thus, the first input circuit 705 and the second input circuit 706 are reset.

As illustrated in FIG. 8, the comparator 80 includes a first reset circuit 807, and the first reset circuit 807 includes a first reset transistor MN5 and a second reset transistor MN6. MN5 and MN6 are NMOS transistors. The gate of NMOS transistor serves as a control terminal, the drain of NMOS transistor serves as a first terminal, and the source of NMOS transistor serves as a second terminal. The drain of MN5 and the drain of MN6 are both connected with the ground terminal, the source of MN5 is connected with the first input circuit 805, and the source of MN6 is connected with the second input circuit 806. The gate of MN5 and the gate of MN6 both receive the clock signal WCK_iB. In the operating state, when the clock signal WCK_iB is changed to a high level, that is, when the comparator 80 enters the reset phase, MN5 and MN6 are triggered by WCK_iB to be in a switched-on state. The first input circuit 805 is connected with the ground terminal via MN5, the second input circuit 806 is connected with the ground terminal via MN6, and the voltages of the respective connecting points are lowered to a low level due to the connection to the ground terminal. Thus, the first input circuit 805 and the second input circuit 806 are reset.

In some embodiments of the disclosure, the second reset circuit includes a third reset transistor and a fourth reset transistor.

A first terminal of the third reset transistor and a first terminal of the fourth reset transistor are both connected with the power terminal or the ground terminal, and a second terminal of the third reset transistor and a second terminal of the fourth reset transistor are connected with the output circuit respectively. The third reset transistor and the fourth reset transistor are PMOS transistors or NMOS transistors. A control terminal of the third reset transistor and a control terminal of the fourth reset transistor both receive a clock signal. When the clock signal triggers the third reset transistor and the fourth reset transistor to be in a switched-on state, the output circuit is connected with the power terminal or the ground terminal via the third reset transistor and the fourth reset transistor to implement the reset.

In the embodiments of the disclosure, whether the third reset transistor and the fourth reset transistor are PMOS transistors or NMOS transistors is determined by the circuit structure of the comparator. FIG. 7 and FIG. 8 illustrate two different circuit structures of the comparator provided by the embodiments of the disclosure, which will be described below with reference to FIG. 7 and FIG. 8 respectively.

As illustrated in FIG. 7, the comparator 70 includes a second reset circuit 709, and the second reset circuit 709 includes a third reset transistor MP7 and a fourth reset transistor MP8. MP7 and MP8 are PMOS transistors. The gate of PMOS transistor serves as a control terminal, the source of PMOS transistor serves as a first terminal, and the drain of PMOS transistor serves as a second terminal. The source of MP7 and the source of MP8 are both connected with the power terminal, the drain of MP7 is connected with the output circuit via the connecting point A, and the drain of MP8 is connected with the output circuit via the connecting point B. The gate of MP7 and the gate of MP8 both receive the clock signal WCK_i. In the operating state, when the clock signal WCK_i is changed to a low level, that is, when the comparator 70 enters the reset phase, MP7 and MP8 are triggered by WCK_i to be in a switched-on state. The output circuit 708 is connected with the power terminal via the connecting point A and the connecting point B respectively, and the voltages of the connecting point A and the connecting point B are raised to a high level due to the connection with the power terminal. Thus, the output circuit 708 is reset.

As illustrated in FIG. 8, the comparator 80 includes a second reset circuit 809, and the second reset circuit 809 includes a third reset transistor MN7 and a fourth reset transistor MN8. MN7 and MN8 are NMOS transistors. The gate of NMOS transistor serves as a control terminal, the source of NMOS transistor serves as a first terminal, and the drain of NMOS transistor serves as a second terminal. The source of MN7 and the source of MN8 are both connected with the ground terminal, the drain of MN7 is connected with the output circuit via the connecting point A, and the drain of MN8 is connected with the output circuit via the connecting point B. The gate of MN7 and the gate of MN8 both receive the clock signal WCK_iB. In the operating state, when the clock signal WCK_iB is changed to a high level, that is, when the comparator 80 enters the reset phase, MN7 and MN8 are triggered by WCK_iB to be in a switched-on state. The output circuit 808 is connected with the ground terminal via the connecting point A and the connecting point B respectively, and the voltages of the connecting point A and the connecting point B are lowered to a low level due to the connection with the ground terminal. Thus, the output circuit 808 is reset.

In some embodiments of the disclosure, the output circuit includes a first output transistor, a second output transistor, a third output transistor, a fourth output transistor, a fifth output transistor, and a sixth output transistor.

A control terminal of the first output transistor, a first terminal of the second output transistor, a control terminal of the third output transistor, a second terminal of the fourth output transistor, and a second terminal of the sixth output transistor are all connected with a first output terminal of the output circuit. A first terminal of the first output transistor, a control terminal of the second output transistor, a second terminal of the third output transistor, a control terminal of the fourth output transistor, and a second terminal of the fifth output transistor are all connected with a second output terminal of the output circuit. A second terminal of the first output transistor is connected with the first input circuit, the second input circuit and the second reset circuit respectively, and a second terminal of the second output transistor is connected with the first input circuit, the second input circuit and the second reset circuit respectively. A first terminal of the third output transistor, a first terminal of the fourth output transistor, a first terminal of the fifth output transistor, and a first terminal of the sixth output transistor are all connected with the power terminal or the ground terminal. The first output transistor and the second output transistor are NMOS transistors or PMOS transistors, and the third output transistor to the sixth output transistor are PMOS transistors or NMOS transistors. A control terminal of the fifth output transistor and a control terminal of the sixth output transistor both receive a clock signal.

In the embodiments of the disclosure, whether the first output transistor and the second output transistor are NMOS transistors or PMOS transistors, and whether the third output transistor to the sixth output transistor are PMOS transistors or NMOS transistors are determined by the circuit structure of the comparator. FIG. 7 and FIG. 8 illustrate two different circuit structures of the comparator provided by the embodiments of the disclosure, which will be described below with reference to FIG. 7 and FIG. 8 respectively.

As illustrated in FIG. 7, the comparator 70 includes the output circuit 708, and the output circuit 708 includes a first output transistor MN10, a second output transistor MN11, a third output transistor MP1, a fourth output transistor MP2, a fifth output transistor MP3 and a sixth output transistor MP4. MN10 and MN11 are NMOS transistors. The gate of NMOS transistor serves as a control terminal, the drain of NMOS transistor serves as a first terminal, and the source of NMOS transistor serves as a second terminal. MP1, MP2, MP3 and MP4 are PMOS transistors. The gate of PMOS transistor serves as a control terminal, the source of PMOS transistor serves as a first terminal, and the drain of PMOS transistor serves as a second terminal. The gate of MN10, the drain of MN11, the gate of MP1, the drain of MP2 and the drain of MP4 are all connected with a first output terminal of the output circuit 708, and the first output terminal of the output circuit 708 outputs an $F_i$ signal in a comparison signal. The drain of MN10, the gate of MN11, the drain of MP1, the gate of MP2 and the drain of MP3 are all connected with a second output terminal of the output circuit 708, the second output terminal of the output circuit 708 outputs an $F_iB$ signal in the comparison signal, $F_iB$ and $F_i$ are inverted signals. The source of MN10 is connected with the first input circuit 705, the second input circuit 706 and the second reset circuit 709 via the connecting point A. The source of MN11 is connected with the first input circuit 705, the second input circuit 706 and the second reset circuit 709 via the connecting point B. The source of MP1, the source of MP2, the source of MP3 and the source of MP4 are all connected with the power terminal. The gate of MP3 and the gate of MP4 both receive the clock signal WCK_i.

When the clock signal WCK_i is at a low level, that is, in the reset phase of the comparator 70, MP3 and MP4 are triggered by WCK_i to maintain the switched-on state. At this time, the voltages of the first output terminal and the second output terminal are maintained at a high level. When the clock signal WCK_i is changed to a high level, that is, when the sampling phase of the comparator 70 begins, MP3 and MP4 are triggered by WCK_i to be changed to a switched-off state. At this time, the output circuit 708 receives the first differential signal or the second differential signal. The voltages of the first output terminal and the second output terminal are affected by the first differential signal or the second differential signal and begin to gradually decrease to a low level, until MP1 and MP2 are triggered to be changed to a switched-on state, then the sampling phase of the comparator 70 ends, and the regeneration phase begins. At the beginning of the regeneration phase of the comparator 70, a cross-coupled inverter composed of MP1 and MP2 amplifies the voltage difference formed between the first output terminal and the second output terminal during the sampling phase via positive feedback. Until the voltage difference is amplified to a sufficient degree, the output circuit 708 latches the voltages of the first output terminal and the second output terminal, and uses the latched levels as comparison subsignals to be output, that is, outputs $F_i$ and $F_iB$.

As illustrated in FIG. 8, the comparator 80 includes the output circuit 808, and the output circuit 808 includes a first output transistor MP10, a second output transistor MP11, a third output transistor MN1, a fourth output transistor MN2, a fifth output transistor MN3 and a sixth output transistor MN4. MP10 and MP11 are PMOS transistors. The gate of PMOS transistor serves as a control terminal, the drain of PMOS transistor serves as a first terminal, and the source of PMOS transistor serves as a second terminal. MN1, MN2, MN3 and MN4 are NMOS transistors. The gate of NMOS transistor serves as a control terminal, the source of NMOS transistor serves as a first terminal, and the drain of NMOS transistor serves as a second terminal. The gate of MP10, the drain of MP11, the gate of MN1, the drain of MN2 and the drain of MN4 are all connected with a first output terminal of the output circuit 808, and the first output terminal of the output circuit 808 outputs an $F_i$ signal in a comparison signal. The drain of MP10, the gate of MP11, the drain of MN1, the gate of MN2 and the drain of MN3 are all connected with a second output terminal of the output circuit 808, the second output terminal of the output circuit 808 outputs an $F_iB$ signal in the comparison signal, and $F_iB$ and $F_i$ are inverted signals. The source of MP10 is connected with the first input circuit 805, the second input circuit 806 and the second reset circuit 809 via the connecting point A, and the source of MP11 is connected with the first input circuit 805, the second input circuit 806 and the second reset circuit 809 via the connecting point B. The source of MN1, the source of MN2, the source of MN3 and the source of MN4 are all connected with the ground terminal. The gate of MN3 and the gate of MN4 both receive the clock signal WCK_iB.

When the clock signal WCK_iB is at a high level, that is, in the reset phase of the comparator 80, MN3 and MN4 are triggered by WCK_iB to maintain a switched-on state. At this time, the voltages of the first output terminal and the second output terminal are maintained at a low level. When the clock signal WCK_iB is changed to a low level, that is, when the sampling phase of the comparator 80 begins, MN3 and MN4 are triggered by WCK_iB to be changed to a switched-off state. At this time, the output circuit 808 receives the first differential signal or the second differential signal. The voltages of the first output terminal and the second output terminal are affected by the first differential signal or the second differential signal and begin to gradually rise to a high level, until MN1 and MN2 are triggered to be changed to a switched-on state, then the sampling phase of the comparator 80 ends, and the regeneration phase begins. At the beginning of the regeneration phase of the comparator 80, a cross-coupled inverter composed of MN1 and MN2 amplifies the voltage difference formed between the first output terminal and the second output terminal in the sampling phase via positive feedback. Until the voltage difference is amplified to a sufficient degree, the output circuit 808 latches the voltages of the first output terminal and the second output terminal, and uses the latched levels as comparison subsignals to be output, that is, outputs $F_i$ and $F_iB$.

Figure 9:
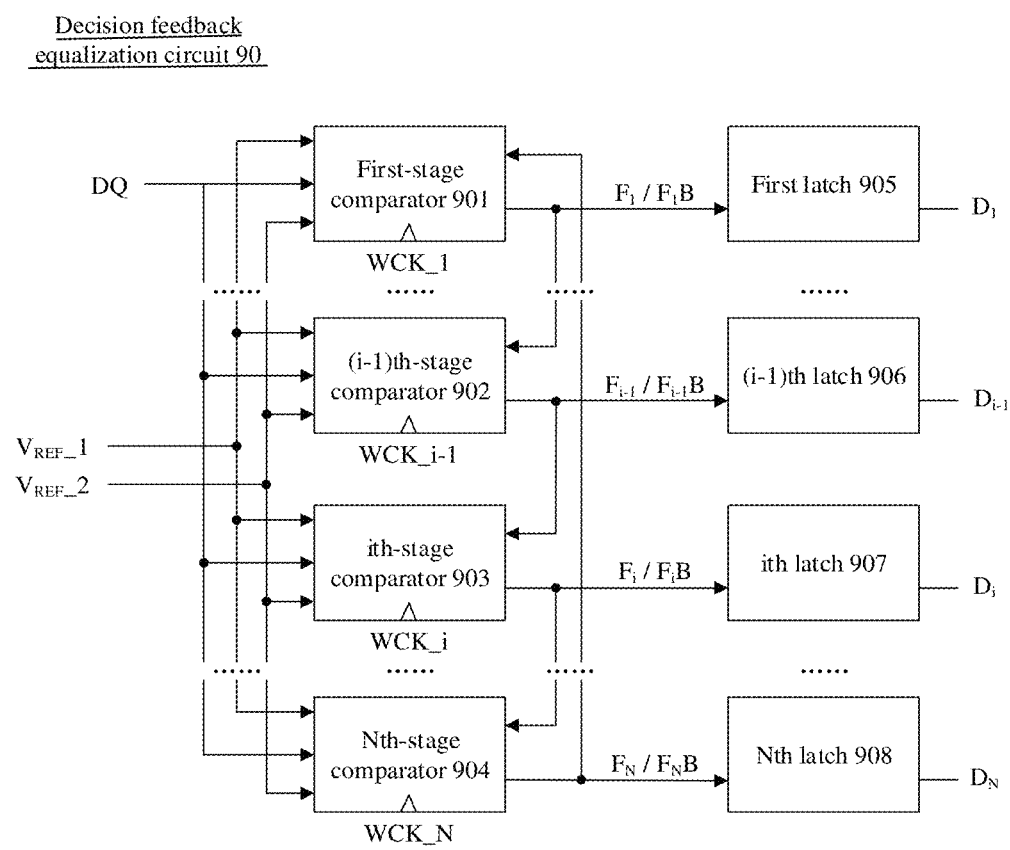
FIG. 9 illustrates a first schematic structural diagram of a decision feedback equalization circuit provided by an embodiment of the disclosure.

FIG. 9 illustrates a schematic structural diagram of a decision feedback equalization circuit provided by an embodiment of the disclosure. As illustrated in FIG. 9, the decision feedback equalization circuit 90 includes N stages of comparators as described in the foregoing embodiments, and N is a positive integer greater than 1.

A first input terminal of the comparator in each stage receives an input signal DQ, a second input terminal of the comparator in each stage receives a first reference signal $V_{REF\_}1$, and a third input terminal of the comparator in each stage receives a second reference signal $V_{REF\_}2$.

A fourth input terminal of the first-stage comparator 901 is connected with an output terminal of the Nth-stage comparator 904, and receives an Nth-stage comparison signal $F_N/F_NB$ output by the Nth-stage comparator 904. A fifth input terminal of the first-stage comparator 901 receives a first clock signal WCK_1.

A fourth input terminal of the ith-stage comparator 903 is connected with an output terminal of the (i−1)th-stage comparator 902, and receives an (i−1)th-stage comparison signal $F_{i-1}/F_{i-1}B$ output by the (i−1)th-stage comparator 902. A fifth input terminal of the ith-stage comparator 903 receives an ith clock signal WCK_i, and i is greater than 1 and less than or equal to N.

Triggered by a clock signal in each stage, and according to a comparison signal corresponding to a fourth input terminal of the comparator in each stage, the comparator in each stage compares the input signal DQ with the first reference signal $V_{REF\_}1$, or compares the input signal DQ with the second reference signal $V_{REF\_}2$, to output a comparison signal in each stage.

In the embodiments of the disclosure, the comparator in each stage in the decision feedback equalization circuit 90 includes five input terminals and one output terminal. The five input terminals of the comparator in each stage respectively receive the input signal DQ, the first reference signal $V_{REF\_}1$, the second reference signal $V_{REF\_}2$, the previous-stage comparison signal (the first-stage comparator receives the Nth-stage comparison signal) and the clock signal corresponding to the comparator in each stage. The output terminal of the comparator in each stage outputs the comparison signal in each stage.

In the embodiments of the disclosure, the comparison signal in each stage includes two mutually inverted signals. The two mutually inverted signals serve as the first feedback signal and the second feedback signal in the above embodiment, and are input to the next-stage comparator (the first-stage comparator receives the Nth-stage comparison signal). For example, $F_{i-1}$ and $F_{i-1}B$ are mutually inverted signals, $F_{i-1}$ is input into the ith-stage comparator as the first feedback signal, and $F_{i-1}B$ is input into the ith-stage comparator as the second feedback signal. In this way, according to the output result of the comparator in each stage, the next-stage comparator is controlled to select the first reference signal $V_{REF\_}1$ or the second reference signal $V_{REF\_}2$ in the sampling phase.

In the embodiments of the disclosure, the phase of the ith clock signal WCK_i is 360°/N later than the phase of the (i−1)th clock signal WCK_i−1. That is, the phase of the clock signal corresponding to the comparator in each stage is one Nth of the clock cycle later than that corresponding to the previous-stage comparator. In this way, the phase of the first clock signal WCK_1 is also later than the phase of the Nth clock signal WCK_N by one Nth of the clock cycle. In this way, since the comparator enters the sampling phase and is under the control of the clock signal, the phase delay between the clock signals will cause the comparator in each stage to enter the sampling phase at respective time nodes in sequence. That is, the comparator in each stage sequentially samples the level of the input signal DQ at respective time nodes in a clock cycle, and outputs a comparison signal in each stage. The time nodes are sequentially spaced by one Nth of the clock cycle. In other words, the comparator in each stage in the decision feedback equalization circuit 90 sequentially samples the symbol of the input signal DQ.

For example, the (i−1)th-stage comparator 902 is controlled by the (i−1)th clock signal WCK_i−1 to enter the sampling phase at the (i−1)th time node, samples the level of the input signal DQ at the (i−1)th time node, and outputs the (i−1)th-stage comparison signal $F_{i-1}/F_{i-1}B$. Then, at the ith time node which is one-Nth clock cycle later than the (i−1)th time node, the ith-stage comparator 903 is controlled by the ith clock signal WCK_i to enter the sampling phase, samples the level of the input signal DQ at the ith time node, and outputs the ith-stage comparison signal $F_i/F_iB$. By analogy, for the Nth time node, the Nth-stage comparator 904 is controlled by the Nth clock signal WCK_N to enter the sampling stage, samples the level of the input signal DQ at the Nth time node, and outputs the Nth-stage comparison signal. After the Nth time node, the comparator enters the next clock cycle. At the (N+1)th time node which is one-Nth clock cycle later than the Nth time node, the first-stage comparator re-enters the sampling stage to sample the level of the input signal.

In this way, the comparison signal in the previous stage received by the comparator in each stage reflects the level of the input signal DQ at the previous time node. Taking the ith-stage comparator as an example, the ith-stage comparator will sample DQ at the ith time node, and the $F_{(i-1)}/F_{(i-1)}B$ signal received by the ith-stage comparator reflects the level of DQ at the (i−1)th time node. Due to the existence of inter-symbol interference, the level of DQ the at the (i−1)th time node will interfere with the level of DQ at the ith time node. The ith-stage comparator may use the received $F_{(i-1)}/F_{(i-1)}B$ signal as a first feedback signal and a second feedback signal, and according to the $F_{i-1}/F_{i-1}B$ signal, a suitable reference signal is selected from the two reference signals and compared with the level of DQ at the ith time node. That is, when the level of DQ at the (i−1)th time node is high, the reference signal with a higher level is selected for comparison; and when the level of DQ at the (i−1)th time node is low, the reference signal with a lower level is selected for comparison, thereby eliminating the influence of inter-symbol interference.

It should be noted that when the decision feedback equalization circuit 90 uses the comparator as described in the above embodiments, corresponding adjustment is needed according to the circuit structure of the used comparator. When the decision feedback equalization circuit 90 uses the comparator 70 as illustrated in FIG. 7 as the ith-stage comparator, the first reference signal $V_{REF}\_1$ may be set to a reference signal $V_{REF}\_P$ with a relatively higher level, the second reference signal $V_{REF}\_2$ may be set to a reference signal $V_{REF}\_N$ with a relatively lower level, and the clock signal WCK_i is input. When the decision feedback equalization circuit 90 uses the comparator 80 illustrated in FIG. 8 as the ith-stage comparator, to achieve the same effect as the comparator 70, the first reference signal $V_{REF}\_1$ needs to be set to a reference signal $V_{REF}\_N$ with a relatively lower level, and the second reference signal $V_{REF}\_2$ needs to be set to a reference signal $V_{REF}\_P$ with a relatively higher level, and the clock signal WCK_iB inverted from WCK_i is input. In other words, the comparator 70 as illustrated in FIG. 7 and the comparator 80 as illustrated in FIG. 8 may be equivalently replaced in the decision feedback equalization circuit 90.

It can be understood that the decision feedback equalization circuit 90 as illustrated in FIG. 9 can use multi-stage comparators to sample the input signals DQ at respective time nodes. When the comparator in each stage samples the DQ at a time node, an appropriate reference signal can be selected according to the level of the DQ at the previous time node, thereby eliminating the influence of inter-symbol interference and improving the accuracy of the output result.

In some embodiments of the disclosure, as illustrated in FIG. 9, the decision feedback equalization circuit 90 further includes N latches.

An input terminal of each latch is connected with an output terminal of the comparator in each stage correspondingly to receive the comparison signal in each stage. Each latch is configured to save the comparison signal in each stage to output a latch signal in each stage.

In the embodiments of the disclosure, each latch included in the decision feedback equalization circuit 90 receives the comparison signal in each stage after being triggered, and saves and outputs the comparison signal in each stage. For example, the ith latch 907, after being triggered, will receive the ith-stage comparison signal $F_i/F_iB$, save $F_i/F_iB$, and output a latch signal Di.

Figure 10:
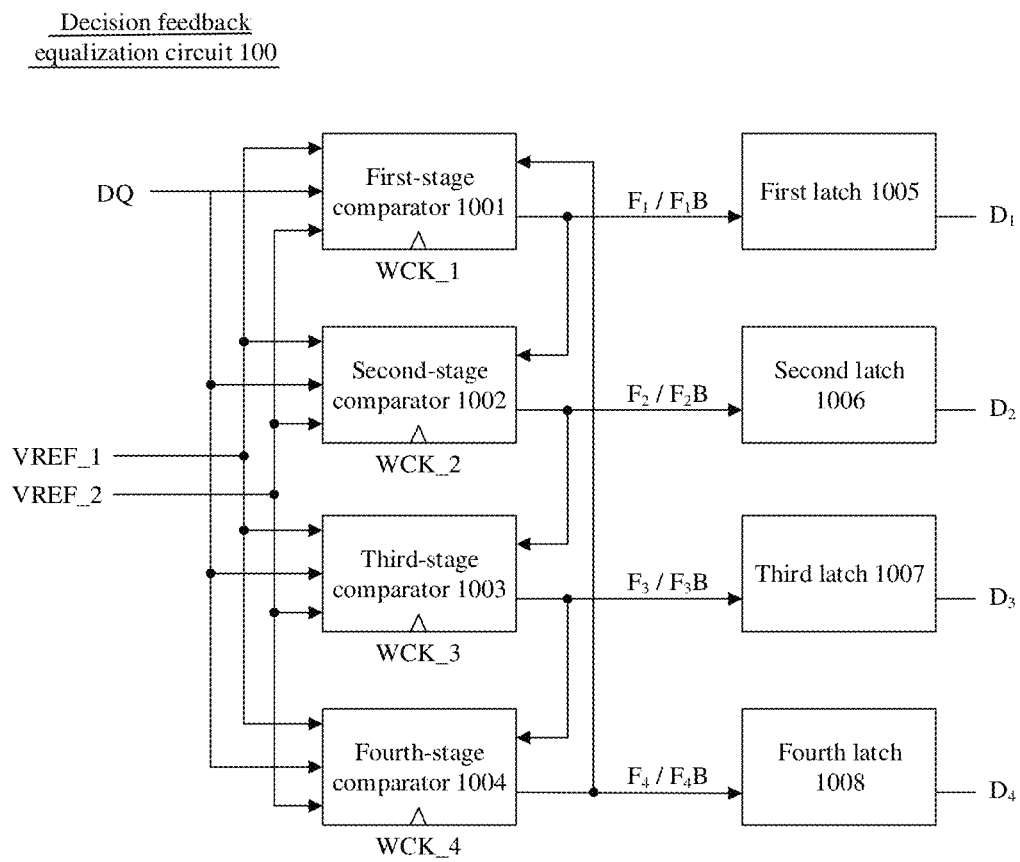
FIG. 10 illustrates a second schematic structural diagram of a decision feedback equalization circuit provided by an embodiment of the disclosure.

In some embodiments of the disclosure, as illustrated in FIG. 10, when N=4, the decision feedback equalization circuit 100 includes 4 stages of comparators as in the above embodiments: a first-stage comparator 1001, a second-stage comparator 1002, a third-stage comparator 1003 and a fourth-stage comparator 1004.

A first input terminal of the comparator in each stage receives an input signal DQ, a second input terminal of the comparator in each stage receives a first reference signal $V_{REF}\_1$, and a third input terminal of the comparator in each stage receives a second reference signal $V_{REF}\_2$.

A fourth input terminal of the first-stage comparator 1001 is connected with an output terminal of the fourth-stage comparator 1004, and receives a fourth-stage comparison signal $F_4/F_4B$ output by the fourth-stage comparator 1004. A fifth input terminal of the first-stage comparator 1001 receives a first clock signal WCK_1.

A fourth input terminal of the second-stage comparator 1002 is connected with an output terminal of the first-stage comparator 1001, and receives a first-stage comparison signal $F_1/F_1B$ output by the first-stage comparator 1001. A fifth input terminal of the second-stage comparator 1002 receives a second clock signal WCK_2.

A fourth input terminal of the third-stage comparator 1003 is connected with an output terminal of the second-stage comparator 1002, and receives a second-stage comparison signal $F_2/F_2B$ output by the second-stage comparator 1002. A fifth input terminal of the third-stage comparator 1003 receives a third clock signal WCK_3.

A fourth input terminal of the fourth-stage comparator 1004 is connected with an output terminal of the third-stage comparator 1003, and receives a third-stage comparison signal $F_3/F_3B$ output by the third-stage comparator 1003. A fifth input terminal of the fourth-stage comparator 1004 receives a fourth clock signal WCK_4.

Triggered by a clock signal in each stage, and according to a comparison signal corresponding to a fourth input terminal of the comparator in each stage, the comparator in each stage compares the input signal DQ with the first reference signal $V_{REF\_}1$, or compares the input signal DQ with the second reference signal $V_{REF\_}2$, to output a comparison signal in each stage.

In the embodiments of the disclosure, the phase of the clock signal corresponding to the comparator in each stage is 90° (that is, a quarter of the clock cycle) later than that corresponding to the comparator of the previous stage. Therefore, the comparator in each stage sequentially samples the level of the input signal DQ at each time node in a clock cycle, and outputs a comparison signal in each stage. The time nodes are sequentially spaced by a quarter of a clock cycle. According to the level of DQ at the previous time node, the comparator in each stage selects the appropriate reference signal from the two reference signals to be compared with the level of DQ at the current time node, thereby eliminating the influence of inter-symbol interference.

In some embodiments of the disclosure, as illustrated in FIG. 10, the decision feedback equalization circuit 100 further includes 4 latches: a first latch 1005, a second latch 1006, a third latch 1007 and a fourth latch 1008.

An input terminal of each latch is connected with an output terminal of the comparator in each stage correspondingly to receive the comparison signal in each stage. Each latch is configured to save the comparison signal in each stage to output a latch signal in each stage.

In the embodiments of the disclosure, each latch included in the decision feedback equalization circuit 100 receives the comparison signal in each stage after being triggered, and saves and outputs the comparison signal in each stage.

FIG. 11 to FIG. 14 illustrate schematic effect diagrams of a decision feedback equalization (DFE) circuit provided by the disclosure.

Figure 11:
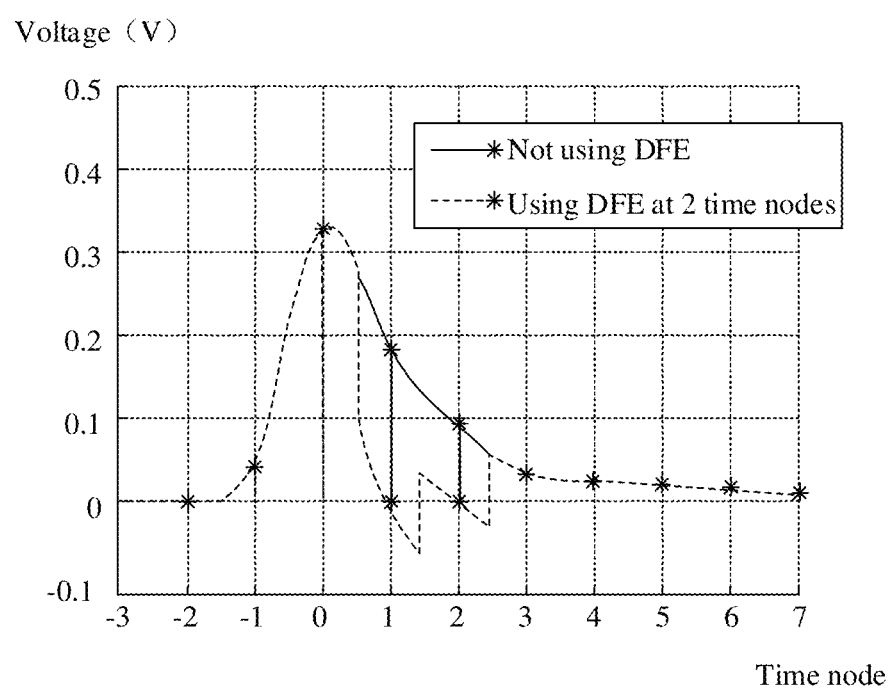
FIG. 11 illustrates a first schematic diagram of an effect of a decision feedback equalization circuit provided by an embodiment of the disclosure.

As illustrated in FIG. 11, without using the DFE, the voltage of the signal at a time node 0 causes inter-symbol interference on the voltages at a time node 1 and a time node 2, the low levels at the time node 1 and the time node 2 are raised, and accurate voltages cannot be sampled. After using DFE at the time node 1 and the time node 2, the sampled voltages are compensated by the DFE and lowered to the original low level, thereby eliminating the influence of inter-symbol interference.

Figure 12:
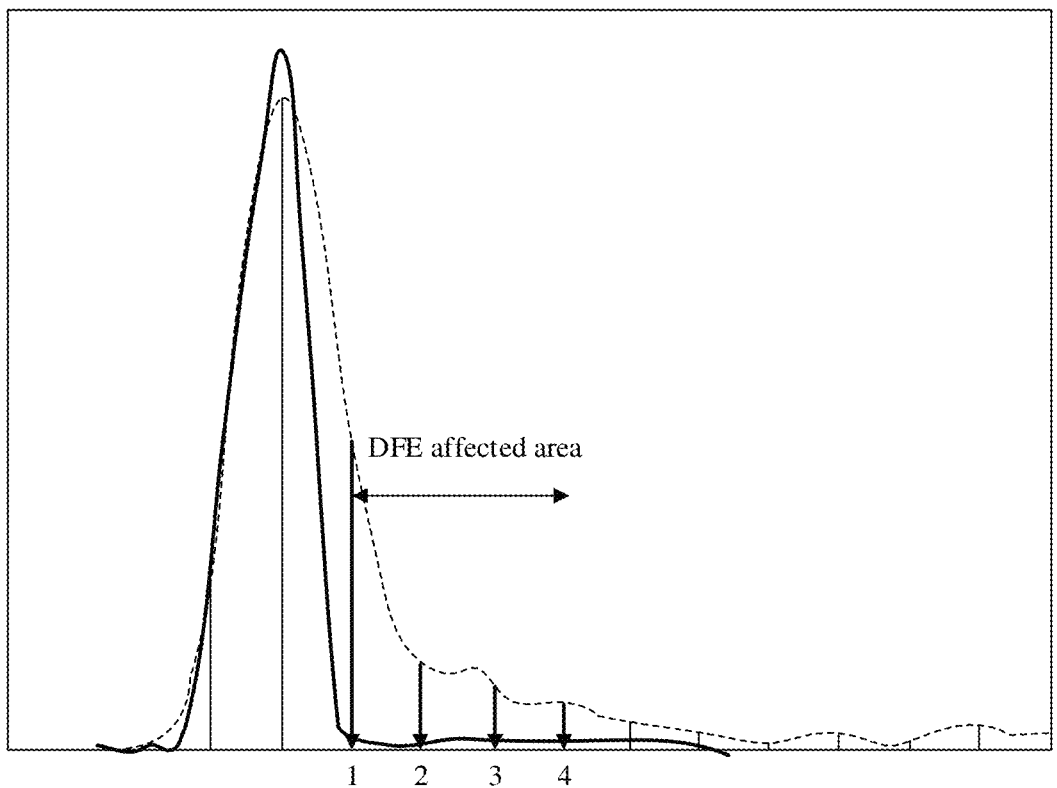
FIG. 12 illustrates a second schematic diagram of an effect of a decision feedback equalization circuit provided by an embodiment of the disclosure.

As illustrated in FIG. 12, after using the DFE at time nodes 1-4, the signals are lowered from the original dotted line to the solid line, and the influence of inter-symbol interference caused by the high level at the previous time node is eliminated.

Figure 13:
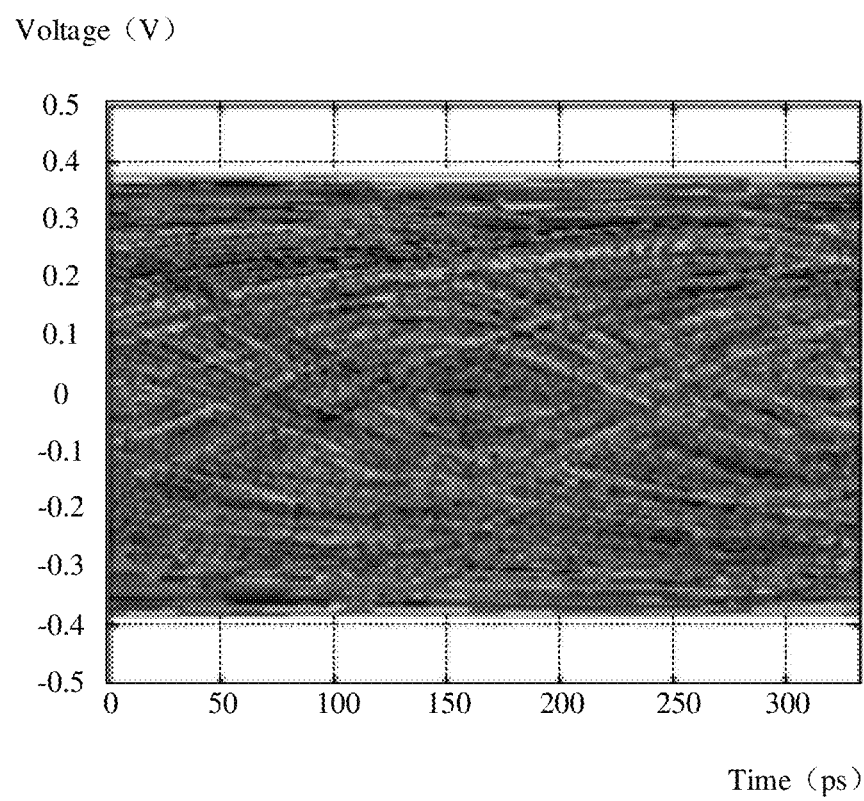
FIG. 13 illustrates a third schematic diagram of an effect of a decision feedback equalization circuit provided by an embodiment of the disclosure.
Figure 14:
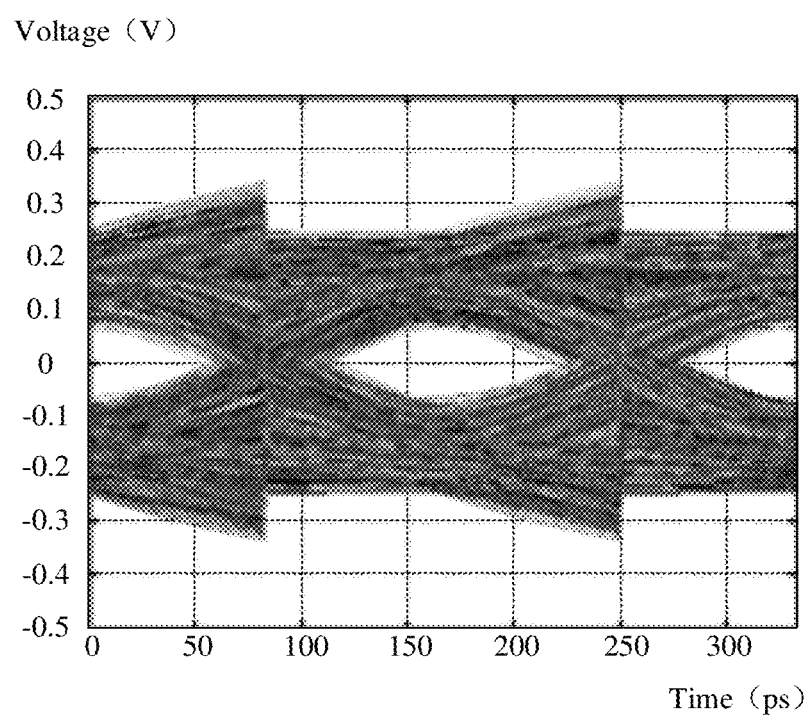
FIG. 14 illustrates a fourth schematic diagram of an effect of a decision feedback equalization circuit provided by an embodiment of the disclosure.

FIG. 13 and FIG. 14 illustrate eye diagrams of two cases where the DFE is not used and the DFE is used. An eye diagram is formed by overlapping the waveforms of each symbol obtained by scanning From the eye diagram, the influence of inter-symbol interference and noise can be observed. The larger the "eyes" in the eye diagram, and the more regular the eye diagram, the smaller the inter-symbol interference; on the contrary, the greater the inter-symbol interference. When the DFE is not used, as illustrated in FIG. 13, the "eyes" in the eye diagram can no longer be seen, and the waveforms of each symbol interfere with each other without obvious boundaries. The inter-symbol interference is very serious, which easily causes symbol judgment errors. After using the DFE, as illustrated in FIG. 14, clear "eyes" are formed in the eye diagram, each symbol waveform has a clear boundary, and the influence of inter-symbol interference is eliminated. In this way, the symbol judgment will be more accurate.

It should be explained that terms "include", "comprise" or any other variations thereof in the disclosure are intended to contain non-exclusive inclusion, so that processes, methods, articles or devices including a series of factors not only include the factors, but also include other factors which are not clearly listed, or further include inherent factors of the processes, methods, articles or devices. Without more restrictions, the factor defined by the sentence "include one . . . " does not exclude that there are other identical factors in the processes, methods, articles or devices including the factor.

The serial numbers of the embodiments of the disclosure are only for description, and do not represent the quality advantages and disadvantages of the embodiments. The methods disclosed in the several method embodiments provided in the disclosure can be combined arbitrarily without conflict to obtain new method embodiments. The features disclosed in the serval product embodiments provided by the disclosure can be combined arbitrarily without conflict to obtain new product embodiments. The features disclosed in the several method or equipment embodiments provided in the disclosure can be combined arbitrarily without conflict to obtain new method embodiments or equipment embodiments.

The foregoing descriptions are merely specific embodiments of the disclosure, but the protection scope of the disclosure is not limited thereto. Any changes or replacements within the technical scope disclosed in the disclosure made by those skilled in the art should fall within the scope of protection of the disclosure. Therefore, the protection scope of the disclosure should be subject to the appended claims.

INDUSTRIAL APPLICABILITY

The embodiments of the disclosure provide a comparator and a decision feedback equalization circuit. The comparator includes a first-stage circuit, a second-stage circuit, a first switching circuit and a second switching circuit. The first-stage circuit includes a first input circuit and a second input circuit. The first input circuit is connected with the first switching circuit, and the second input circuit is connected with the second switching circuit. The first switching circuit, the second switching circuit, the first input circuit and the second input circuit are further connected with the ground terminal or the power terminal respectively. The first input circuit and the second input circuit are both further connected with the second-stage circuit. The second-stage circuit is connected with the power terminal or the ground terminal. The first switching circuit is configured to control the conduction of the first input circuit according to a first feedback signal, a second feedback signal and a clock signal. The second switching circuit is configured to control the conduction of the second input circuit according to the first feedback signal, the second feedback signal and the clock signal. The first input circuit is configured to generate a first differential signal according to an input signal and a first reference signal in a sampling phase when being switched on. The second input circuit is configured to generate a second differential signal according to the input signal and a second reference signal in the sampling phase when being switched on. The second-stage circuit is configured to amplify and latch the first differential signal or the second differential signal in a regeneration phase to output a comparison signal.

In this way, by controlling the conduction of the first input circuit and the second input circuit, a more suitable one of the first reference signal and the second reference signal is selected for comparison with the input signal, thereby eliminating the influence of inter-symbol interference. At the same time, the first switching circuit is connected with the first input circuit from another port, and the second switching circuit is connected with the second input circuit from another port, which do not affect direct connection of the first input circuit and the second input circuit with the ground terminal or the power terminal respectively. Therefore, a smaller number of transistors may be used in the main circuit path of the comparator, so that the total operating voltage may be reduced under the condition that the divided voltage of each transistor is unchanged.

What is claimed is:

1. A comparator, comprising a first-stage circuit, a second-stage circuit, a first switching circuit and a second switching circuit, wherein the first-stage circuit comprises a first input circuit and a second input circuit;
   the first input circuit is connected with the first switching circuit, the second input circuit is connected with the second switching circuit;
   the first switching circuit and the second switching circuit are further connected with a ground terminal or a power terminal respectively, the first input circuit and the second input circuit are further connected with the ground terminal or the power terminal respectively, the first input circuit and the second input circuit are both further connected with the second-stage circuit;
   the second-stage circuit is connected with the power terminal or the ground terminal;
   the first switching circuit is configured to control conduction of the first input circuit according to a first feedback signal, a second feedback signal and a clock signal;
   the second switching circuit is configured to control conduction of the second input circuit according to the first feedback signal, the second feedback signal and the clock signal;
   the first input circuit is configured to generate a first differential signal according to an input signal and a first reference signal in a sampling phase when being switched on;
   the second input circuit is configured to generate a second differential signal according to the input signal and a second reference signal in a sampling phase when being switched on; and
   the second-stage circuit is configured to amplify and latch the first differential signal or the second differential signal in a regeneration phase to output a comparison signal;
   wherein the first switching circuit comprises a first switching-on circuit and a first switching-off circuit;
   the first switching-on circuit and the first switching-off circuit are both connected with a control terminal of the first input circuit, the first switching-off circuit is further connected with the ground terminal or the power terminal,
   the first switching-on circuit is configured to conduct the clock signal to the control terminal of the first input circuit under a control of the first feedback signal;
   the first switching-off circuit is configured to conduct the control terminal of the first input circuit to the ground terminal of the power terminal under a control of the second feedback signal, so that the first input circuit is switched off; and the first feedback signal and the second feedback signal are mutually inverted signals.

2. The comparator of claim 1, wherein the first-stage circuit further comprises a first reset circuit;
   the first input circuit and the second input circuit are connected via the first reset circuit, the first reset circuit is further connected with the power terminal or the ground terminal; and
   the first reset circuit is configured to reset the first input circuit and the second input circuit in a reset phase.

3. The comparator of claim 1, wherein the second switching circuit comprises a second switching-on circuit and a second switching-off circuit;
   the second switching-on circuit and the second switching-off circuit are both connected with a control terminal of the second input circuit, the second switching-off circuit is further connected with the ground terminal or the power terminal;
   the second switching-on circuit is configured to conduct the clock signal to the control terminal of the second input circuit under the control of the second feedback signal; and
   the second switching-off circuit is configured to conduct the control terminal of the second input circuit to the ground terminal or the power terminal under the control of the first feedback signal, so that the second input circuit is switched off.

4. The comparator of claim 3, wherein the first switching-on circuit comprises a first switching transistor, the first switching-off circuit comprises a second switching transistor;
   a second terminal of the first switching transistor and a first terminal of the second switching transistor are both connected with the control terminal of the first input circuit, a second terminal of the second switching transistor is further connected with the ground terminal or the power terminal, the first switching transistor and the second switching transistor are Negative-Metal-Oxide-Semiconductor (NMOS) transistors or Positive-Metal-Oxide-Semiconductor (PMOS) transistors; and
   a control terminal of the first switching transistor receives the first feedback signal, a first terminal of the first switching transistor receives the clock signal, and a control terminal of the second switching transistor receives the second feedback signal.

5. The comparator of claim 4, wherein the second switching-on circuit comprises a third switching transistor, the second switching-off circuit comprises a fourth switching transistor;
   a second terminal of the third switching transistor and a first terminal of the fourth switching transistor are both connected with the control terminal of the second input circuit, a second terminal of the fourth switching transistor is also connected with the ground terminal or the power terminal, the third switching transistor and the fourth switching transistor are NMOS transistors or PMOS transistors; and
   a control terminal of the third switching transistor receives the second feedback signal, a first terminal of the third switching transistor receives the clock signal, and a control terminal of the fourth switching transistor receives the first feedback signal.

6. The comparator of claim 5, wherein
   when the first feedback signal triggers the first switching transistor and the fourth switching transistor to be in a switched-on state, the second feedback signal triggers the second switching transistor and the third switching transistor to be in a switched-off state, so that the clock signal is input to the control terminal of the first input circuit via the first switching transistor, and the control terminal of the second input circuit is connected with the ground terminal or the power terminal via the fourth switching transistor;

when the first feedback signal triggers the first switching transistor and the fourth switching transistor to be in a switched-off state, the second feedback signal triggers the second switching transistor and the third switching transistor to be in a switched-on state, so that the control terminal of the first input circuit is connected with the ground terminal or the power terminal via the second switching transistor, and the clock signal is input to the control terminal of the second input circuit via the third switching transistor.

7. A comparator, comprising a first-stage circuit, a second-stage circuit, a first switching circuit and a second switching circuit, wherein the first-stage circuit comprises a first input circuit and a second input circuit;

the first input circuit is connected with the first switching circuit, the second input circuit is connected with the second switching circuit;

the first switching circuit and the second switching circuit are further connected with a ground terminal or a power terminal respectively, the first input circuit and the second input circuit are further connected with the ground terminal or the power terminal respectively, the first input circuit and the second input circuit are both further connected with the second-stage circuit;

the second-stage circuit is connected with the power terminal or the ground terminal;

the first switching circuit is configured to control conduction of the first input circuit according to a first feedback signal, a second feedback signal and a clock signal;

the second switching circuit is configured to control conduction of the second input circuit according to the first feedback signal, the second feedback signal and the clock signal;

the first input circuit is configured to generate a first differential signal according to an input signal and a first reference signal in a sampling phase when being switched on;

the second input circuit is configured to generate a second differential signal according to the input signal and a second reference signal in a sampling phase when being switched on; and the second-stage circuit is configured to amplify and latch the first differential signal or the second differential signal in a regeneration phase to output a comparison signal;

wherein the first input circuit comprises a first input transistor, a second input transistor and a third input transistor;

a first terminal of the first input transistor and a first terminal of the second input transistor are respectively connected with the second-stage circuit;

a control terminal of the third input transistor serves as the control terminal of the first input circuit, a second terminal of the third input transistor is connected with the ground terminal or the power terminal;

a second terminal of the first input transistor and a second terminal of the second input transistor are both connected with a first terminal of the third input transistor;

the first to third input transistors are NMOS transistors or PMOS transistors;

a control terminal of the first input transistor receives the input signal, a control terminal of the second input transistor receives the first reference signal; and when the third input transistor is triggered by the clock signal to be in a switched-on state, the first input transistor and the second input transistor generate the first differential signal according to the input signal and the first reference signal, and output the first differential signal to the second-stage circuit.

8. A comparator, comprising a first-stage circuit, a second-stage circuit, a first switching circuit and a second switching circuit, wherein the first-stage circuit comprises a first input circuit and a second input circuit;

the first input circuit is connected with the first switching circuit, the second input circuit is connected with the second switching circuit;

the first switching circuit and the second switching circuit are further connected with a ground terminal or a power terminal respectively, the first input circuit and the second input circuit are further connected with the ground terminal or the power terminal respectively, the first input circuit and the second input circuit are both further connected with the second-stage circuit;

the second-stage circuit is connected with the power terminal or the ground terminal;

the first switching circuit is configured to control conduction of the first input circuit according to a first feedback signal, a second feedback signal and a clock signal;

the second switching circuit is configured to control conduction of the second input circuit according to the first feedback signal, the second feedback signal and the clock signal;

the first input circuit is configured to generate a first differential signal according to an input signal and a first reference signal in a sampling phase when being switched on;

the second input circuit is configured to generate a second differential signal according to the input signal and a second reference signal in a sampling phase when being switched on; and the second-stage circuit is configured to amplify and latch the first differential signal or the second differential signal in a regeneration phase to output a comparison signal;

wherein the second input circuit comprises a fourth input transistor, a fifth input transistor and a sixth input transistor;

a first terminal of the fourth input transistor and a first terminal of the fifth input transistor are connected with the second-stage circuit respectively;

a control terminal of the sixth input transistor serves as the control terminal of the second input circuit, a second terminal of the sixth input transistor is connected with the ground terminal or the power terminal;

a second terminal of the fourth input transistor and a second terminal of the fifth input transistor are both connected with a first terminal of the sixth input transistor;

the fourth to sixth input transistors are NMOS transistors or PMOS transistors;

a control terminal of the fourth input transistor receives the input signal, a control terminal of the fifth input transistor receives the second reference signal; and when the sixth input transistor is triggered by the clock signal to be in a switched-on state, the fourth input transistor and the fifth input transistor generate the second differential signal according to the input signal and the second reference signal, and output the second differential signal to the second-stage circuit.

9. The comparator of claim 2, wherein the first reset circuit comprises a first reset transistor and a second reset transistor;
   a first terminal of the first reset transistor and a first terminal of the second reset transistor are both connected with the power terminal or the ground terminal, a second terminal of the first reset transistor is connected with the first input circuit, a second terminal of the second reset transistor is connected with the second input circuit, and the first reset transistor and the second reset transistor are PMOS transistors or NMOS transistors;
   a control terminal of the first reset transistor and a control terminal of the second reset transistor both receive the clock signal; and
   when the clock signal triggers the first reset transistor and the second reset transistor to be in a switched-on state, the first input circuit is connected with the power terminal or the ground terminal via the first reset transistor to reset the first input circuit, and the second input circuit is connected with the power terminal or the ground terminal via the second reset transistor to reset the second input circuit.

10. The comparator of claim 1, wherein the second-stage circuit comprises an output circuit and a second reset circuit;
    the second reset circuit is connected with the output circuit, the output circuit is further connected with the power terminal or the ground terminal, the second reset circuit is further connected with the power terminal or the ground terminal;
    the output circuit is configured to amplify and latch the first differential signal or the second differential signal in a regeneration phase to output the comparison signal; and
    the second reset circuit is configured to reset the output circuit in a reset phase.

11. The comparator of claim 10, wherein the second reset circuit comprises a third reset transistor and a fourth reset transistor;
    a first terminal of the third reset transistor and a first terminal of the fourth reset transistor are both connected with the power terminal or the ground terminal, a second terminal of the third reset transistor and a second terminal of the fourth reset transistor are connected with the output circuit respectively, the third reset transistor and the fourth reset transistor are PMOS transistors or NMOS transistors;
    a control terminal of the third reset transistor and a control terminal of the fourth reset transistor both receive the clock signal; and
    when the clock signal triggers the third reset transistor and the fourth reset transistor to be in a switched-on state, the output circuit is connected with the power terminal or the ground terminal via the third reset transistor and the fourth reset transistor to reset the output circuit.

12. The comparator of claim 10, wherein
    the output circuit comprises a first output transistor, a second output transistor, a third output transistor, a fourth output transistor, a fifth output transistor and a sixth output transistor;
    a control terminal of the first output transistor, a first terminal of the second output transistor, a control terminal of the third output transistor, a second terminal of the fourth output transistor, and a second terminal of the sixth output transistor are all connected with a first output terminal of the output circuit;
    a first terminal of the first output transistor, a control terminal of the second output transistor, a second terminal of the third output transistor, a control terminal of the fourth output transistor, and a second terminal of the fifth output transistor are all connected with a second output terminal of the output circuit;
    a second terminal of the first output transistor is connected with the first input circuit, the second input circuit and the second reset circuit respectively, and a second terminal of the second output transistor is connected with the first input circuit, the second input circuit and the second reset circuit respectively;
    a first terminal of the third output transistor, a first terminal of the fourth output transistor, a first terminal of the fifth output transistor and a first terminal of the sixth output transistor are all connected with the power terminal or the ground terminal;
    the first output transistor and the second output transistor are NMOS transistors or PMOS transistors; the third to sixth output transistors are PMOS transistors or NMOS transistors; and
    a control terminal of the fifth output transistor and a control terminal of the sixth output transistor both receive the clock signal.

13. The comparator of claim 1, wherein
    a voltage of the first reference signal is greater than or less than a voltage of the second reference signal.

14. A decision feedback equalization circuit, comprising N stages of the comparator of claim 1, wherein N is a positive integer greater than 1;
    a first input terminal of the comparator in each stage receives an input signal, a second input terminal of the comparator in each stage receives a first reference signal, a third input terminal of the comparator in each stage receives a second reference signal;
    a fourth input terminal of the first-stage comparator is connected with an output terminal of the Nth-stage comparator, and receives an Nth-stage comparison signal output by the Nth-stage comparator; a fifth input terminal of the first-stage comparator receives a first clock signal;
    a fourth input terminal of the ith-stage comparator is connected with an output terminal of the (i−1)th-stage comparator, and receives an (i−1)th-stage comparison signal output by the (i−1)th-stage comparator; a fifth input terminal of the ith-stage comparator receives an ith clock signal, i is greater than 1 and less than or equal to N; and
    triggered by a clock signal in each stage, and according to a comparison signal corresponding to a fourth input terminal of the comparator in each stage, the comparator in each stage compares the input signal with the first reference signal, or compares the input signal with the second reference signal, to output a comparison signal in each stage.

15. The decision feedback equalization circuit of claim 14, wherein
    a phase of the ith clock signal is 360°/N later than a phase of the (i−1)th clock signal.

16. The decision feedback equalization circuit of claim 14, wherein when N=4, the fourth input terminal of the first-stage comparator is connected with an output terminal of the fourth-stage comparator, and receives a fourth-stage comparison signal output by the fourth-stage comparator; and the fifth input terminal of the first-stage comparator receives a first clock signal.

17. The decision feedback equalization circuit of claim 14, further comprising N latches, wherein an input terminal of each latch is connected with an output terminal of the comparator in each stage to receive a comparison signal in each stage; and each latch is configured to save the comparison signal in each stage to output a latch signal in each stage.

* * * * *